(12) United States Patent
Shima

(10) Patent No.: US 11,996,335 B2
(45) Date of Patent: May 28, 2024

(54) MANUFACTURING METHOD OF SEMICONDUCTOR DEVICE

(71) Applicant: Kioxia Corporation, Tokyo (JP)

(72) Inventor: Masaya Shima, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 222 days.

(21) Appl. No.: 17/471,062

(22) Filed: Sep. 9, 2021

(65) Prior Publication Data

US 2022/0293476 A1 Sep. 15, 2022

(30) Foreign Application Priority Data

Mar. 9, 2021 (JP) .................................. 2021-037778

(51) Int. Cl.
| | |
|---|---|
| *H01L 21/66* | (2006.01) |
| *G03F 7/00* | (2006.01) |
| *H01L 21/768* | (2006.01) |
| *H01L 23/522* | (2006.01) |

(52) U.S. Cl.
CPC .......... *H01L 22/12* (2013.01); *G03F 7/70525* (2013.01); *G03F 7/7065* (2013.01); *H01L 21/76838* (2013.01); *H01L 23/5226* (2013.01)

(58) Field of Classification Search
None
See application file for complete search history.

(56) References Cited

U.S. PATENT DOCUMENTS

| | | | |
|---|---|---|---|
| 8,101,435 B2 | 1/2012 | Shizuno | |
| 8,801,279 B2 | 8/2014 | Kim et al. | |
| 10,825,696 B2 | 11/2020 | Yu et al. | |
| 11,315,805 B2 | 4/2022 | Yu et al. | |
| 2008/0305565 A1 | 12/2008 | Shizuno | |
| 2008/0311684 A1 | 12/2008 | Tu et al. | |
| 2011/0266692 A1* | 11/2011 | Sasaki | H01L 22/22 |
| | | | 257/E21.597 |
| 2019/0043537 A1 | 2/2019 | Yamada et al. | |
| 2020/0006089 A1 | 1/2020 | Yu et al. | |
| 2020/0090708 A1 | 3/2020 | Yamada et al. | |
| 2021/0074553 A1 | 3/2021 | Yu et al. | |
| 2021/0166365 A1 | 6/2021 | Inoue et al. | |
| 2022/0254656 A1 | 8/2022 | Yu et al. | |

FOREIGN PATENT DOCUMENTS

| | | |
|---|---|---|
| CN | 110676179 A | 1/2020 |
| JP | 2008306105 A | 12/2008 |
| JP | 2012142576 A | 7/2012 |
| JP | 2013041896 A | 2/2013 |

(Continued)

*Primary Examiner* — Alexander G Ghyka
(74) *Attorney, Agent, or Firm* — Holtz, Holtz & Volek PC

(57) ABSTRACT

A manufacturing method of a semiconductor device includes inspecting each of plural chip regions of a substrate and determining the inspected chip region as a non-defective chip region or a defective chip region, the substrate including the plural chip regions formed as one system, and the plural chip regions being arranged in a planar direction on the substrate. The method includes forming a wiring, the wiring being connected to an electrode of the non-defective chip region among the plural chip regions, and the wiring being not connected to an electrode of the defective chip region among the plural chip regions.

7 Claims, 25 Drawing Sheets

(56) References Cited

FOREIGN PATENT DOCUMENTS

| TW | 202006347 A | 2/2020 |
|---|---|---|
| WO | 2011115041 A1 | 9/2011 |
| WO | 2012173238 A1 | 12/2012 |
| WO | 2017126014 A1 | 7/2017 |
| WO | 2017126291 A1 | 7/2017 |

* cited by examiner

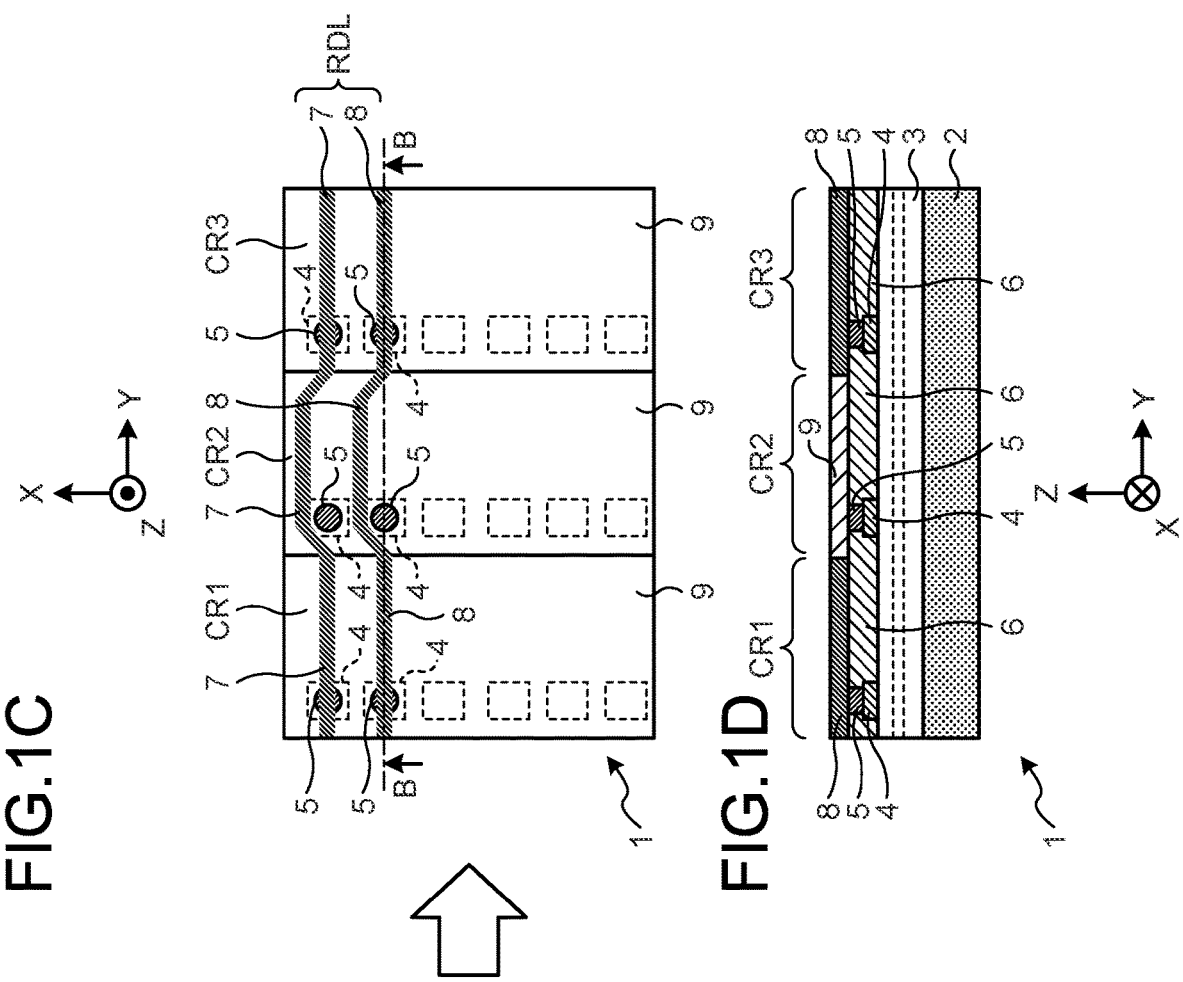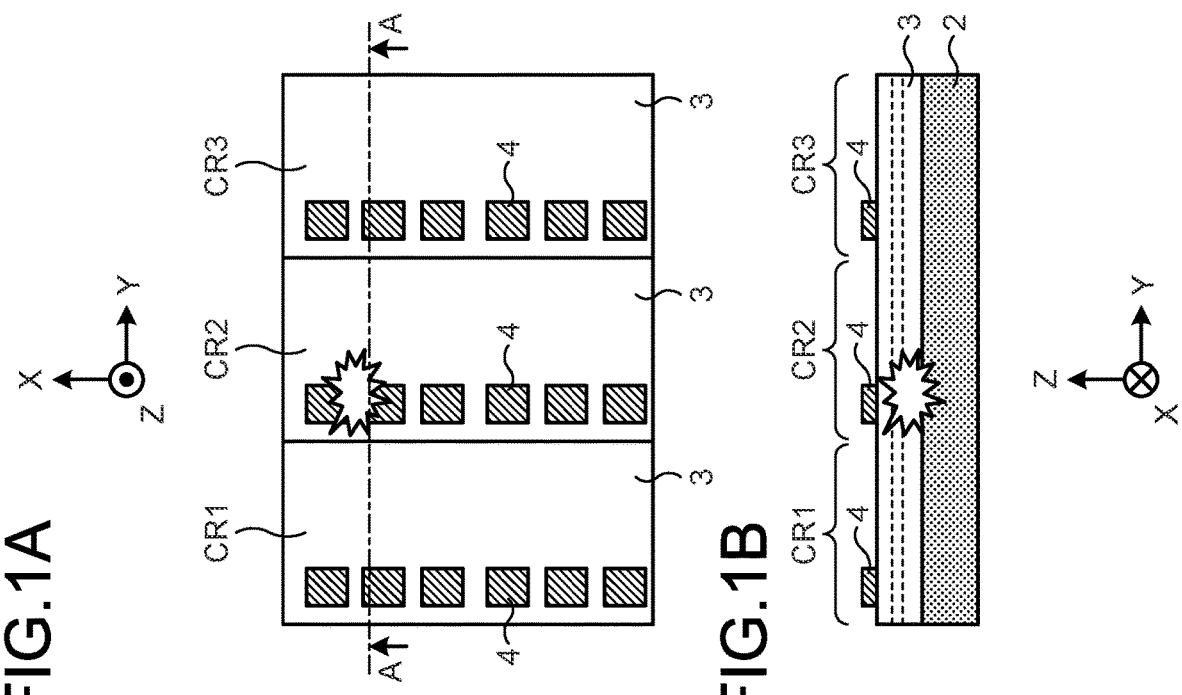

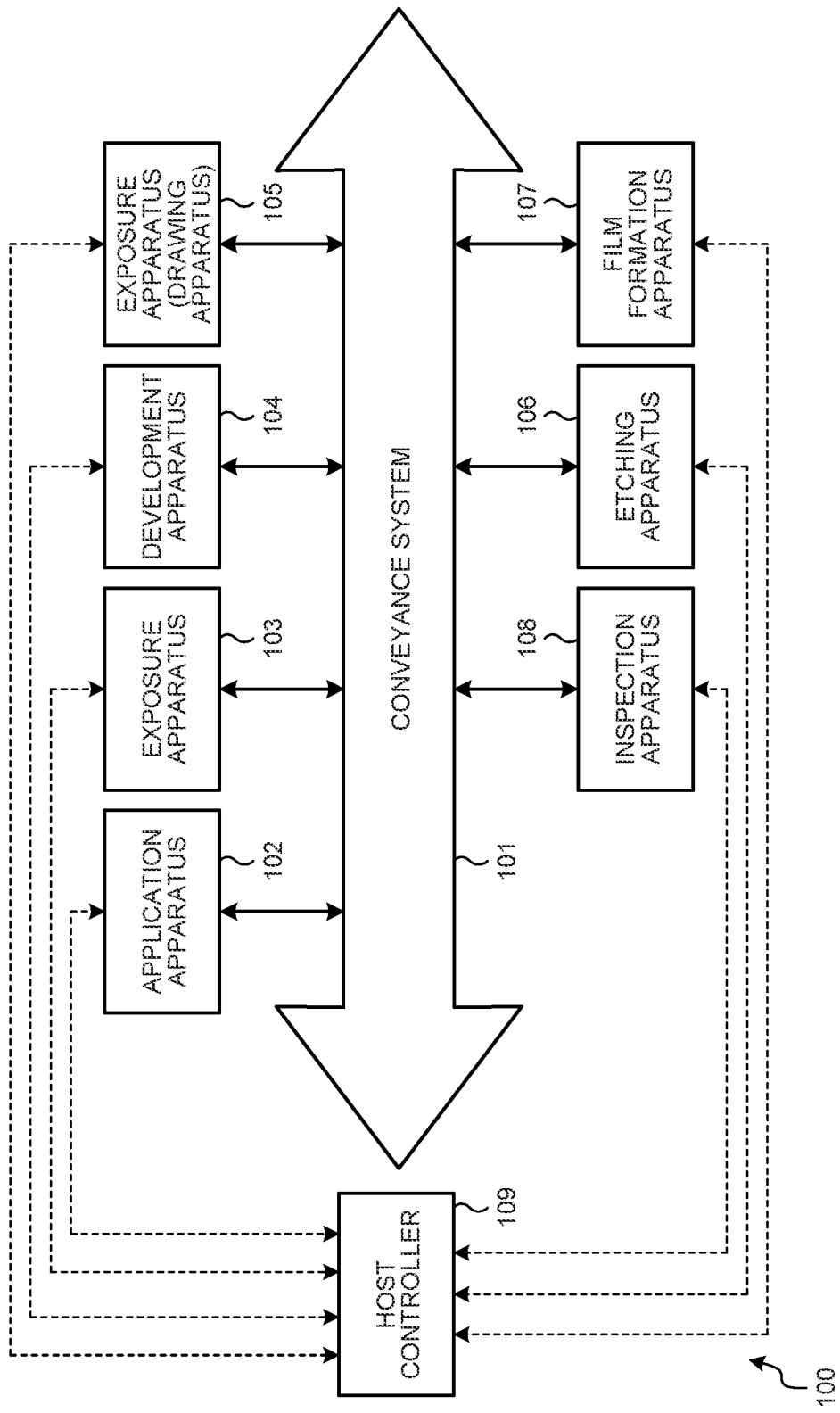

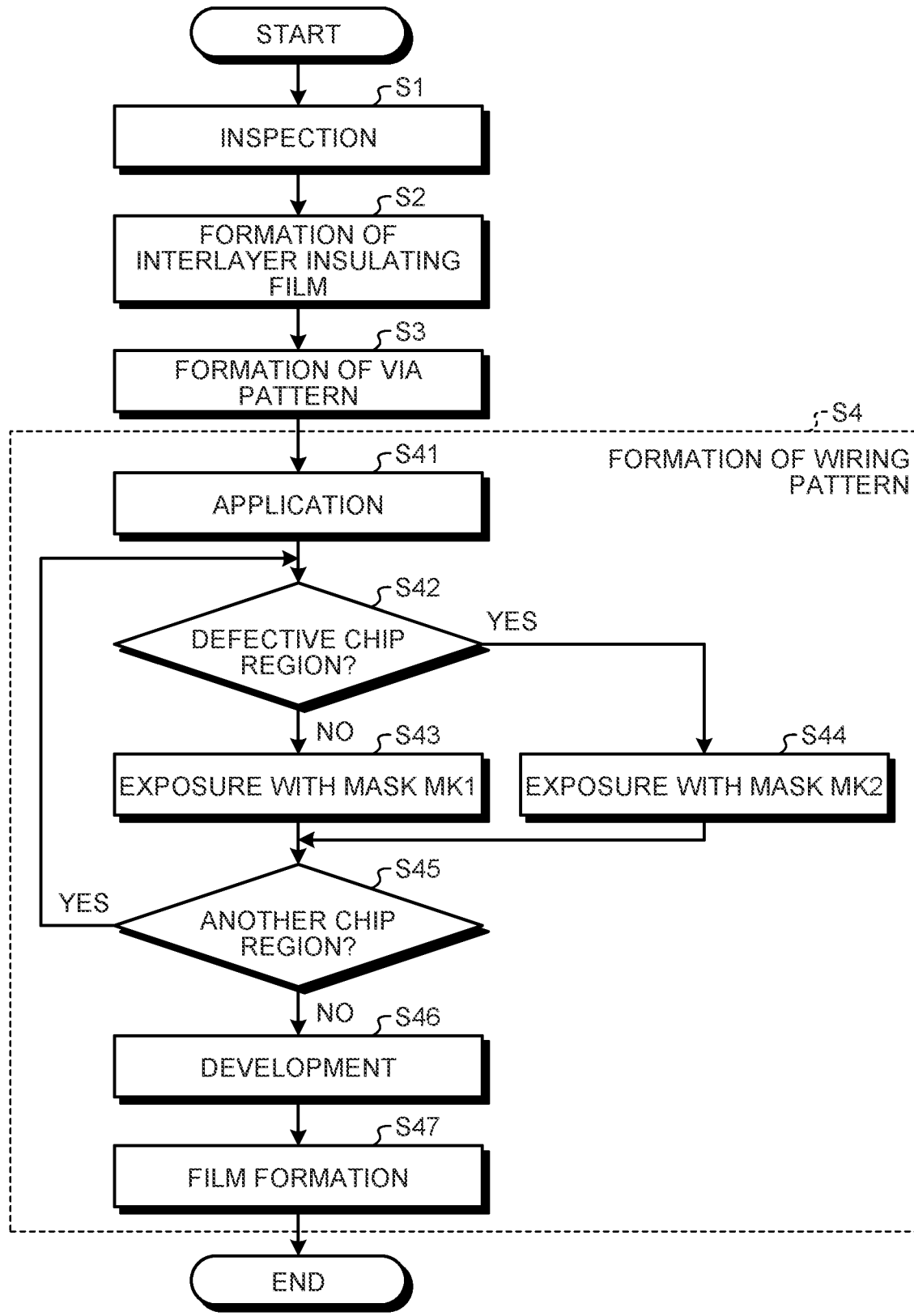

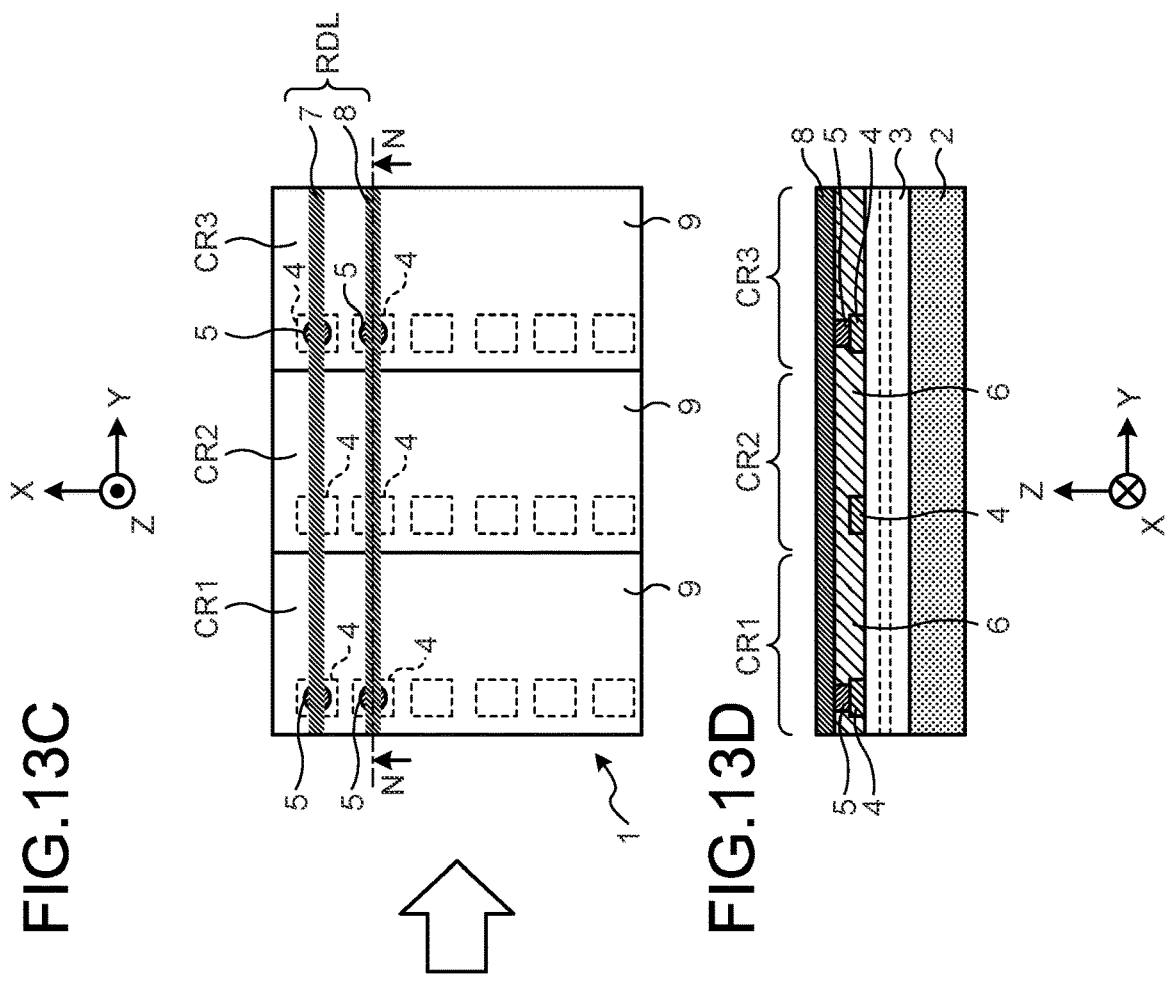
FIG.13A
FIG.13B
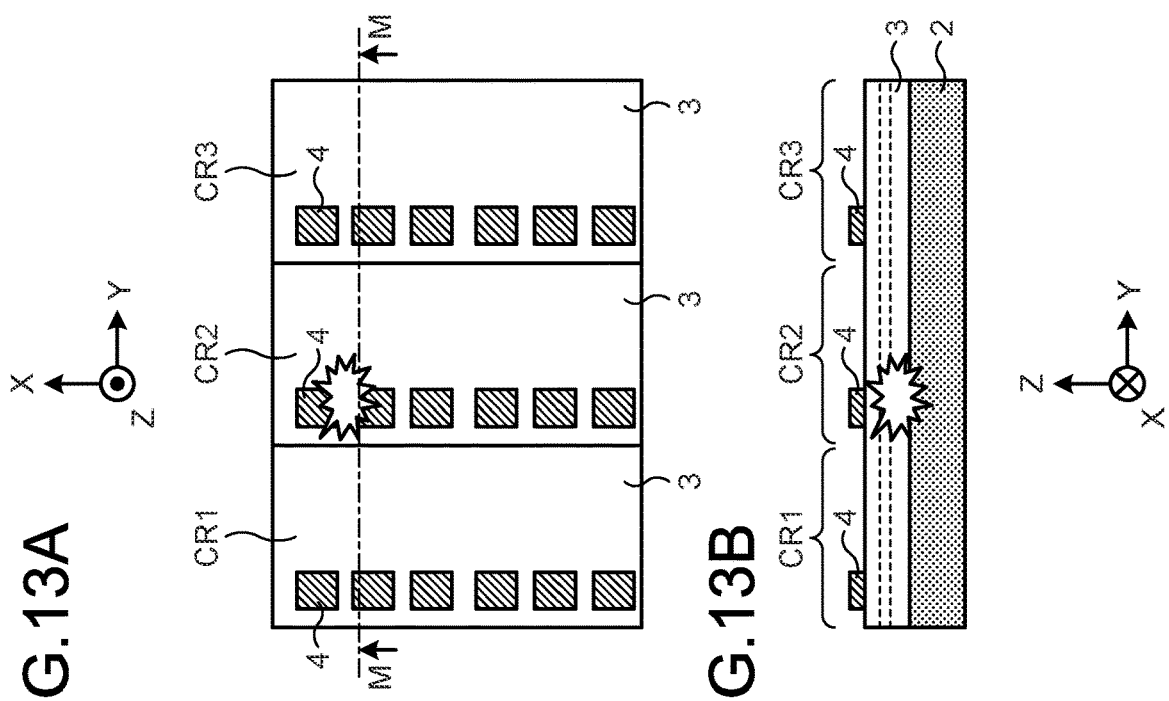
FIG.13C
FIG.13D

MANUFACTURING METHOD OF SEMICONDUCTOR DEVICE

CROSS-REFERENCE TO RELATED APPLICATIONS

This application is based upon and claims the benefit of priority from Japanese Patent Application No. 2021-037778, filed on Mar. 9, 2021; the entire contents of which are incorporated herein by reference.

FIELD

Embodiments described herein relate generally to a manufacturing method of a semiconductor device, a semiconductor manufacturing system, and a semiconductor device.

BACKGROUND

In a manufacturing method of a semiconductor device, plurality chip regions are formed on a substrate, and the semiconductor device is manufactured. Herein, it is desired to improve the manufacturing yield of the semiconductor device.

BRIEF DESCRIPTION OF THE DRAWINGS

FIG. 1A to FIG. 1D are plan views and cross-sectional views illustrating outlines of a manufacturing method of a semiconductor device according to a first embodiment;

FIG. 2 is a diagram illustrating a configuration of a semiconductor manufacturing system to which a manufacturing method of the semiconductor device according to the first embodiment is applied;

FIG. 3 is a flow chart illustrating the manufacturing method of the semiconductor device according to the first embodiment;

FIG. 13A to FIG. 13D are plan views and cross-sectional views illustrating a manufacturing method of a semiconductor device according to a second embodiment;

DETAILED DESCRIPTION

Figure 4A:
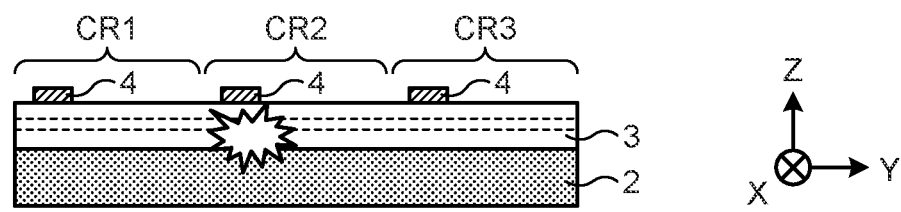
FIG. 4A to FIG. 4C are cross-sectional views illustrating the manufacturing method of the semiconductor device according to the first embodiment.

In general, according to one embodiment, there is provided a manufacturing method of a semiconductor device. The method includes inspecting each of plural chip regions of a substrate and determining the inspected chip region as a non-defective chip region or a defective chip region, the substrate including the plural chip regions formed as one system, the plural chip regions arranged in a planar direction on the substrate. The method includes forming a wiring, the wiring being connected to an electrode of the non-defective chip region among the plural chip regions, the wiring being not connected to an electrode of the defective chip region among the plural chip regions.

Exemplary embodiments of a manufacturing method of a semiconductor device will be explained below in detail with reference to the accompanying drawings. The present invention is not limited to the following embodiments.

First Embodiment

In a manufacturing method of a semiconductor device according to a first embodiment, plural chip regions are formed on a substrate to manufacture the semiconductor device. In some cases, wiring coupling the plural chip regions is formed to manufacture the semiconductor device that functions as one large system. In a case in which the semiconductor device in which plural chip regions are coupled as one system is manufactured, if the whole system is defective due to a defect of one of the chip regions, the manufacturing yield of the semiconductor device tends to be lowered. For example, if leakage and/or short-circuiting of a power wire which couples the plural chip regions occurs, it is difficult to prevent the whole system from becoming defective.

Therefore, in the present embodiment, an inspection is carried out for each chip region of the substrate on which the plural chip regions are arranged in a planar direction to determine whether it is a non-defective chip region or a defective chip region, and wiring which is connected to electrodes of the non-defective chip regions and not connected to electrodes of the defective chip regions is formed to improve the manufacturing yield of the semiconductor device.

Specifically, a semiconductor device 1 can be manufactured as illustrated in FIG. 1A to FIG. 1D. FIG. 1A to FIG. 1D are plan views and cross-sectional views illustrating outlines of a manufacturing method of the semiconductor device 1. Hereinafter, a direction perpendicular to a surface of the substrate 2 is a Z-direction, and two directions orthogonal to each other in a plane perpendicular to the Z-direction are an X-direction and a Y-direction. FIG. 1A and FIG. 1C are XY plan views illustrating the outlines of the manufacturing method of the semiconductor device 1. FIG. 1B and FIG. 1D are YZ cross-sectional views illustrating the outlines of the manufacturing method of the semiconductor device 1 and illustrating cross-sections of cases in which FIG. 1A and FIG. 1C are sectioned by a line A-A and a line B-B, respectively.

As illustrated in FIG. 1A, the semiconductor device 1 has plural chip regions CR1 to CR3 coupled and functions as one system. The semiconductor device 1 may be, for example, a system wafer on which plural chip regions are mounted as one system or may be a system chip on which plural chip regions are mounted as one system. The chip regions CR1 to CR3 may have mutually similar functions.

In manufacturing of the semiconductor device 1, device structures 3 are formed on the substrate 2, electrodes 4 are formed on the device structures 3, and inspections such as operation tests are carried out as illustrated in FIG. 1A and FIG. 1B. Then, each chip region CR is subjected to determination whether it is a non-defective chip region or a defective chip region, and inspection results including the determination result are generated. FIG. 1A and FIG. 1B illustrate an example in which the chip region CR2 is determined to be a defective chip region, and the chip regions CR1 and CR3 are determined to be non-defective chip regions.

After via conductors 5 are formed, as illustrated in FIG. 1C and FIG. 1D, the inspection results are subjected to feed-forward, and a wiring method of a rewiring layer RDL to be formed thereafter is changed. For example, the rewiring layer RDL including lines which are connected to the electrodes of the non-defective chip regions among the plural chip regions and are not connected to the electrodes of the defective chip regions is formed. FIG. 1C and FIG. 1D illustrate, as an example, lines 7 and 8 which are connected to the electrodes 4 of the non-defective chip regions CR1 and CR3 and are not connected to the electrodes 4 of the defective chip region CR2. When viewed through in the Z-direction, each of the lines 7 and 8 is formed in a pattern that passes through the electrodes 4 and the via conductors 5 of the non-defective chip regions CR1 and CR3 and bypasses the electrodes 4 and the via conductors 5 of the defective chip region CR2. The line 7 is, for example, a power line, and the line 8 is, for example, a ground line.

More specifically, the semiconductor device 1 can be manufactured as illustrated in FIG. 3 by using a semiconductor manufacturing system 100 illustrated in FIG. 2. FIG. 2 is a diagram illustrating a configuration of the semiconductor manufacturing system 100. FIG. 3 is a flow chart illustrating a manufacturing method of the semiconductor device 1.

The semiconductor manufacturing system 100 has a conveyance system 101, an application apparatus 102, an exposure apparatus 103, a development apparatus 104, an exposure apparatus 105, an etching apparatus 106, a film formation apparatus 107, an inspection apparatus 108, and a host controller 109. The conveyance system 101, the application apparatus 102, the exposure apparatus 103, the development apparatus 104, the exposure apparatus 105, the etching apparatus 106, the film formation apparatus 107, and the inspection apparatus 108 are configured so that substrates can be conveyed mutually via the conveyance system 101.

The host controller 109 is communicably connected to the conveyance system 101, the application apparatus 102, the exposure apparatus 103, the development apparatus 104, the exposure apparatus 105, the etching apparatus 106, the film formation apparatus 107, and the inspection apparatus 108 via communication wires (not illustrated). The host controller 109 controls each of the conveyance system 101, the conveyance system 101, the application apparatus 102, the exposure apparatus 103, the development apparatus 104, the exposure apparatus 105, the etching apparatus 106, the film formation apparatus 107, and the inspection apparatus 108.

Note that the exposure apparatus 103 is an exposure apparatus which uses masks, and the exposure apparatus 105 is an exposure apparatus of a direct imaging type which does not use masks. The exposure apparatus 103 irradiates a substrate with exposure light, which has been obtained by irradiating a mask, to transfer a pattern of an original plate to the substrate. The exposure apparatus 105 irradiates the substrate with exposure light depending on pattern data to draw a pattern on a photosensitive material.

In the manufacturing method of the semiconductor device 1, film formation on the substrate 2 by the film formation apparatus 107, application of a photosensitive material by the application apparatus 102, formation of a latent image pattern on the photosensitive material by the exposure apparatuses 103 and 105, development of a latent image pattern by the development apparatus 104, processing of a film via the developed pattern of the photosensitive material, etc. are repeatedly carried out.

Figure 4B:
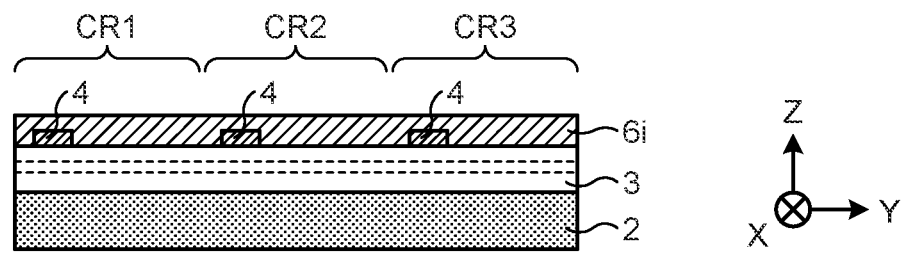
Figure 4C:
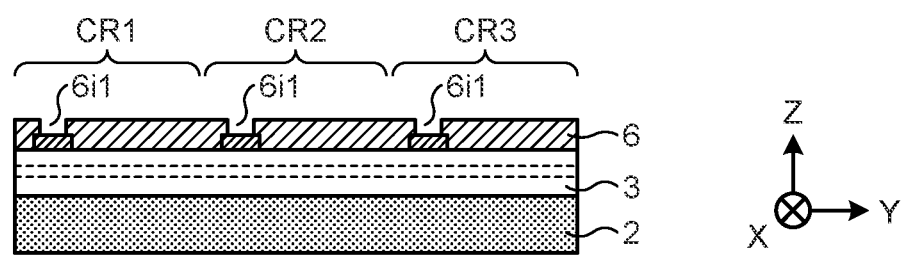

As a result, as illustrated in FIG. 4A, the device structures 3 are formed in the plural chip regions CR1 to CR3. FIG. 4A to FIG. 4C are cross-sectional views illustrating the manufacturing method of the semiconductor device 1. The device structures 3 of the chip regions CR1 to CR3 are, for example, structures of memory devices and may have mutually similar structures. In each of the chip regions CR1 to CR3, the device structure 3 includes an electrically-conductive pattern, and the electrodes 4 are formed in a +Z-side surface thereof. The electrodes 4 are electrically connected to the electrically-conductive pattern of the device structure 3. Note that test electrodes 4' (not illustrated) may be further formed. The test electrode 4' is electrically connected to the electrically-conductive pattern of the device structure 3.

The conveyance system 101 conveys the substrate 2 to the inspection apparatus 108. The inspection apparatus 108 has a stage on which the substrate 2 is placed and inspects the chip regions CR1 to CR3 of the substrate 2 (S1). If the test electrodes 4' are formed, the inspection apparatus 108 causes a prober to contact the electrode 4' of each of the chip regions CR1 to CR3 and supplies a test signal to the device structure 3 via the prober and the electrode 4' to carry out an operation test of the device structure 3. If the test electrodes 4' are not formed, the electrodes 4 may be also used as test electrodes. More specifically, the inspection apparatus 108 causes the prober to contact the electrode 4 of each of the chip regions CR1 to CR3 and supplies a test signal to the device structure 3 via the prober and the electrode 4 to carry out an operation test or the like of the device structure 3.

The host controller 109 acquires inspection results from the inspection apparatus 108. As illustrated in FIG. 4A, in accordance with the inspection results, the host controller 109 determines whether it is a non-defective chip region or a defective chip region for each chip region CR and generates and retains inspection result information including the determination results thereof. FIG. 4A illustrates, as an example, a case in which the host controller 109 determines the chip region CR2 as a defective chip region and determines the chip regions CR1 and CR3 as non-defective chip regions. The host controller 109 has a storage unit, associates the inspection result information with an identifier of the substrate 2, and stores the information in the storage unit. The inspection result information is the information in which the identification information of the chip region CR and the information indicating non-defective chip regions or defective chip regions is associated with each other. The inspection result information may be information in a table form. The inspection result information may be two-dimensional information such as a wafer map in which the information of a position in a wafer of the chip region CR and the information indicating non-defective chip regions or defective chip regions is associated with each other.

When the inspection (S1) is completed, an interlayer insulating film 6i is formed (S2). The conveyance system 101 conveys the substrate 2 from the inspection apparatus 108 to the application apparatus 102. When the substrate 2 is placed on a stage of the application apparatus 102, the application apparatus 102 applies an insulating material to the substrate 2. The insulating material is a solution which is to serve as the interlayer insulating film 6i and can be formed of a positive-type photosensitive material or a negative-type photosensitive material. The positive-type photosensitive material includes a novolac-based resin, a polyimide (PI) resin, a rubber-based resin, an acrylic resin, etc. The negative-type photosensitive material includes a novolac-based resin, a polyimide (PI) resin, a rubber-based resin, an acrylic resin, etc. As a result, as illustrated in FIG. 4B, the interlayer insulating film 6i which covers the device structures 3 and the electrodes 4 of the chip regions CR1 to CR3 is formed.

Then, a pattern of the via conductors 5 is formed (S3). The conveyance system 101 conveys the substrate 2 from the application apparatus 102 to the exposure apparatus 103.

In the exposure apparatus 103, the conveyed substrate 2 is set on a substrate stage. The exposure apparatus 103 subjects the interlayer insulating film 6i above the substrate 2 to exposure with a mask MK0 for a via opening pattern. As a result, a latent image pattern corresponding to mask data is formed on the interlayer insulating film 6i. The conveyance system 101 conveys the substrate 2 after the exposure to the development apparatus 104.

The development apparatus 104 develops the latent image pattern formed on the interlayer insulating film 6i and forms, on the interlayer insulating film 6, an opening pattern 6i1 as illustrated in FIG. 4C on the substrate 2. The opening pattern 6i1 is formed in each of the chip regions CR1 to CR3 and exposes +Z-side surfaces of the electrodes 4 corresponding to the lines 7 and 8 among the plural electrodes 4 of the chip regions CR1 to CR3. The conveyance system 101 conveys the substrate 2, on which the opening pattern 6i1 is formed, from the development apparatus 104 to the film formation apparatus 107.

Figure 5A:
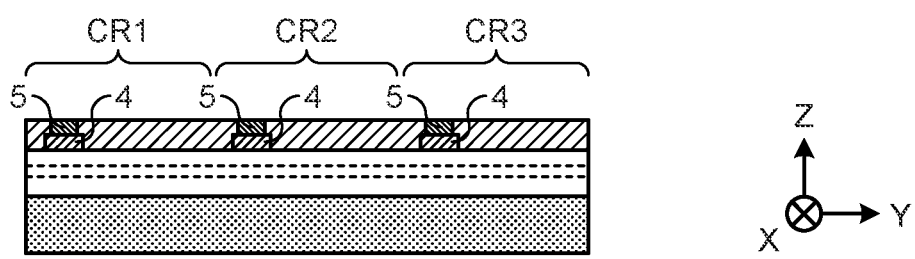
FIG. 5A and FIG. 5B are cross-sectional views illustrating the manufacturing method of the semiconductor device according to the first embodiment.
Figure 5B:
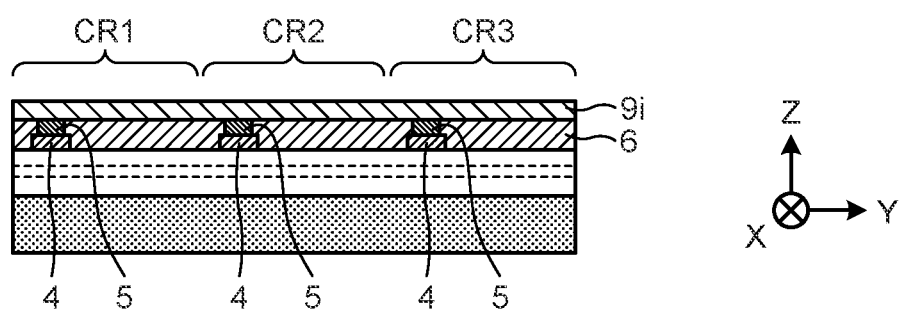

The film formation apparatus 107 embeds an electrically-conductive substance in the opening pattern 6i1 by CVD, plating, or the like. The electrically-conductive substance may be a material which includes metal such as tungsten, copper, or the like as a main component. As a result, as illustrated in FIG. 5A, the via conductors 5 are formed in the +Z-side of the electrodes 4 in each of the chip regions CR1 to CR3.

Then, a wiring pattern is formed (S4). Specifically, processes of S41 to S47 are carried out.

The conveyance system 101 conveys the substrate 2 from the film formation apparatus 107 to the application apparatus 102. When the substrate 2 is placed on the stage of the application apparatus 102, the application apparatus 102 applies a resist 9i to the substrate 2 (S41). The resist 9i is formed in a region in which wiring is not to be formed and is removed after wiring formation. The resist 9i can be formed of a positive-type photosensitive material or a negative-type photosensitive material. The positive-type photosensitive material includes a novolac-based resin, a polyimide (PI) resin, a rubber-based resin, an acrylic resin, etc. The negative-type photosensitive material includes a novolac-based resin, a polyimide (PI) resin, a rubber-based resin, an acrylic resin, etc.

In the exposure apparatus 103, the conveyed substrate 2 is set on the substrate stage. The exposure apparatus 103 acquires the inspection result information of the substrate 2. The inspection result information may be acquired from the host controller 109 via a communication line or may be acquired by directly inputting the information to the exposure apparatus 103. When the exposure apparatus 103 determines a chip region serving as an exposure target among the plural chip regions of the substrate 2, the exposure apparatus 103 references the inspection result information and determines whether the chip region serving as the exposure target is a defective chip region or not (S42).

If the chip region serving as the exposure target is a non-defective chip region (No in S42), the exposure apparatus 103 carries out a following operation. If a mask is not set on a mask stage, the exposure apparatus 103 sets a mask MK1 for a non-defective chip region on the mask stage. If the mask MK1 is set on the mask stage, the exposure apparatus 103 maintains that state. If a mask MK2 is set on the mask stage, the exposure apparatus 103 removes the mask MK2 from the mask stage and sets the mask MK1 on the mask stage. The exposure apparatus 103 subjects the resist 9i, which is above the substrate 2, to exposure with the mask MK1 (S43). The exposure apparatus 103 illuminates the mask MK1 on the mask stage with an illumination optical system and projects illumination light thereof to the substrate 2 on the substrate stage with a projection optical system to subject the substrate 2 to exposure. As a result, a latent image pattern corresponding to the mask data for non-defective chip regions is formed on the resist 9i.

If the chip region serving as the exposure target is a defective chip region (Yes in S42), the exposure apparatus 103 carries out a following operation. If the mask is not set on the mask stage, the exposure apparatus 103 sets the mask MK2 for defective chip regions on the mask stage. If the mask MK2 is set on the mask stage, the exposure apparatus 103 maintains that state. If the mask MK1 is set on the mask stage, the exposure apparatus 103 removes the mask MK1 from the mask stage and sets the mask MK2 on the mask stage. The exposure apparatus 103 subjects the resist 9$i$, which is above the substrate 2, to exposure with the mask MK2 (S44). The exposure apparatus 103 illuminates the mask MK2 on the mask stage with the illumination optical system and projects the illumination light thereof to the substrate 2 on the substrate stage with a projection optical system to subject the substrate 2 to exposure. As a result, a latent image pattern corresponding to the mask data for defective chip regions is formed on the resist 9$i$.

When the exposure process of S43 or S44 is completed, the exposure apparatus 103 determines whether another chip region to be subjected to exposure is present or not (S45). If another chip region to be subjected to exposure is present (Yes in S45), the exposure apparatus 103 returns the process to S42. The exposure apparatus 103 again determines whether the chip region serving as the exposure target is a defective chip region or not (S42). In other words, the exposure apparatus 103 carries out the exposure process while switching between the mask MK1 for non-defective chip regions and the mask MK2 for defective chip regions for each chip region depending on the inspection result information.

Figure 6A:
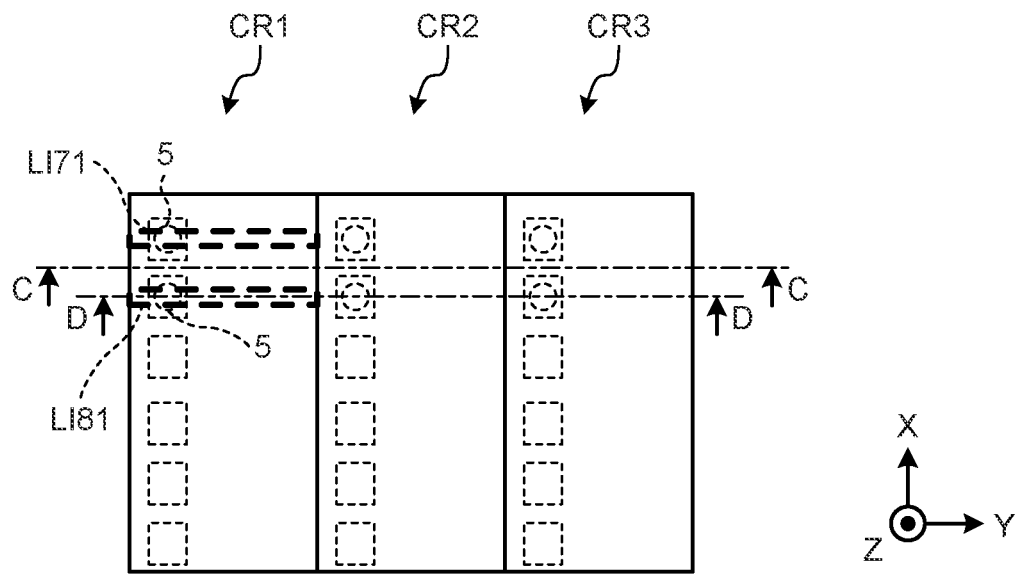
FIG. 6A to FIG. 6C are a plan view and cross-sectional vies illustrating the manufacturing method of the semiconductor device according to the first embodiment.
Figure 6B:
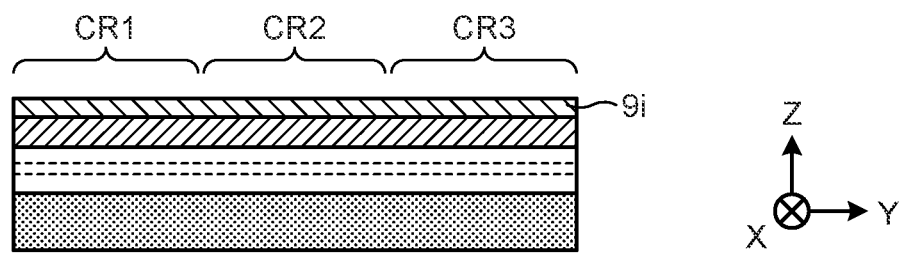
Figure 6C:
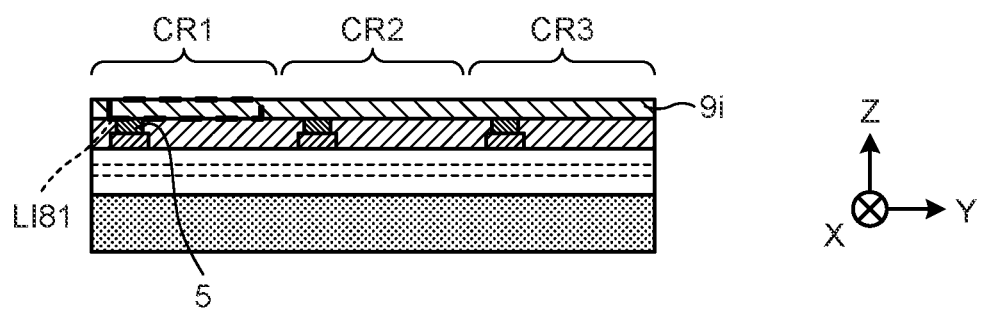

For example, if the exposure target is the chip region CR1, latent image patterns LI71 and LI81 illustrated in FIG. 6A to FIG. 6C are formed on the resist 9$i$ by using the mask MK1 for non-defective chip regions. FIG. 6A to FIG. 6C are a plan view and cross-sectional views illustrating the manufacturing method of the semiconductor device and illustrate, as an example, a case in which the chip region CR1 serving as the exposure target is a non-defective chip region. FIG. 6A is an XY plan view and illustrates, as an example, the latent image patterns LI71 and LI81 which pass through the via conductors 5 of the chip region CR1 when viewed through in the Z-direction. FIG. 6B is a YZ cross-sectional view of a case in which the XY plan view of FIG. 6A is sectioned by a line C-C and illustrates that no latent image pattern is formed in the region between the plural via conductors 5. FIG. 6C is a YZ cross-sectional view of a case in which the XY plan view of FIG. 6A is sectioned by a line D-D and illustrates that, for example, the latent image pattern LI81 is formed in a vicinity region of the via conductors 5.

Figure 7A:
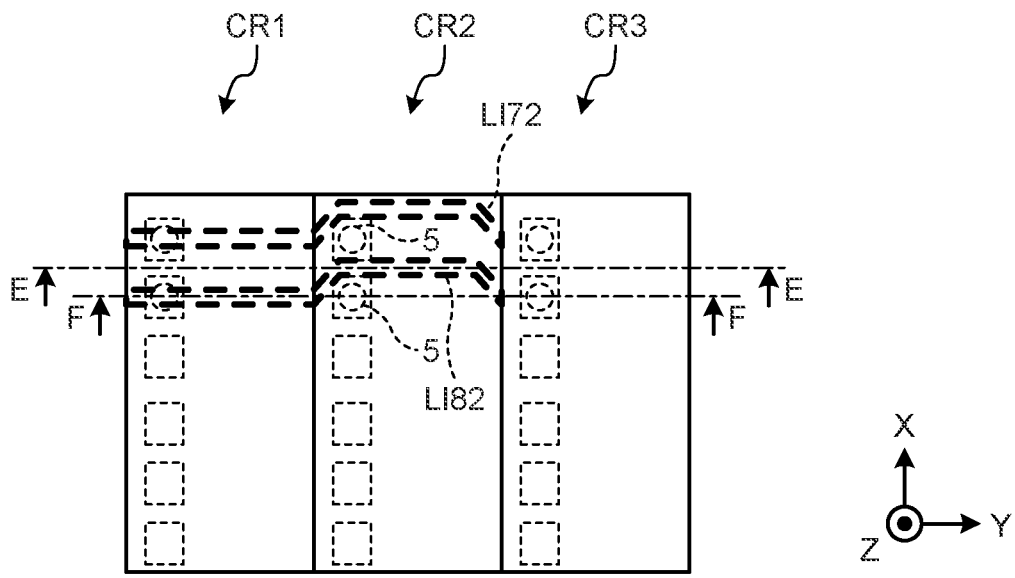
FIG. 7A to FIG. 7C are a plan view and cross-sectional views illustrating the manufacturing method of the semiconductor device according to the first embodiment.
Figure 7B:
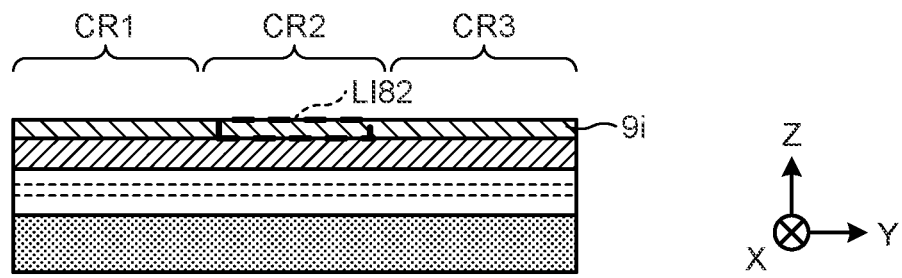
Figure 7C:
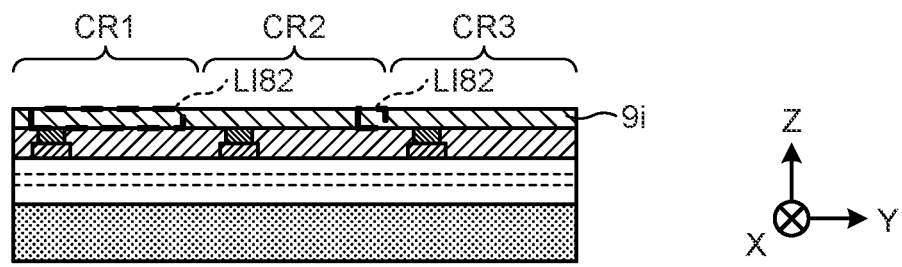

If the exposure target is the chip region CR2, latent image patterns LI72 and LI82 illustrated in FIG. 7A to FIG. 7C are formed on the resist 9$i$ by using the mask MK2 for defective chip regions. FIG. 7A to FIG. 7C are a plan view and cross-sectional views illustrating the manufacturing method of the semiconductor device and illustrate, as an example, a case in which the chip region CR2 serving as the exposure target is a defective chip. FIG. 7A is an XY plan view and illustrates, as an example, the latent image patterns LI72 and LI82 which bypass the via conductors 5 of the chip region CR2 when viewed through in the Z-direction. FIG. 7B is a YZ cross-sectional view of a case in which the XY plan view of FIG. 7A is sectioned by a line E-E and illustrates that the latent image pattern LI82 is formed in a region between the plural via conductors 5. FIG. 7C is a YZ cross-sectional view of a case in which the XY plan view of FIG. 7A is sectioned by a line F-F and illustrates that the latent image pattern LI82 is formed by bypassing a vicinity region of the via conductors 5.

Figure 8A:
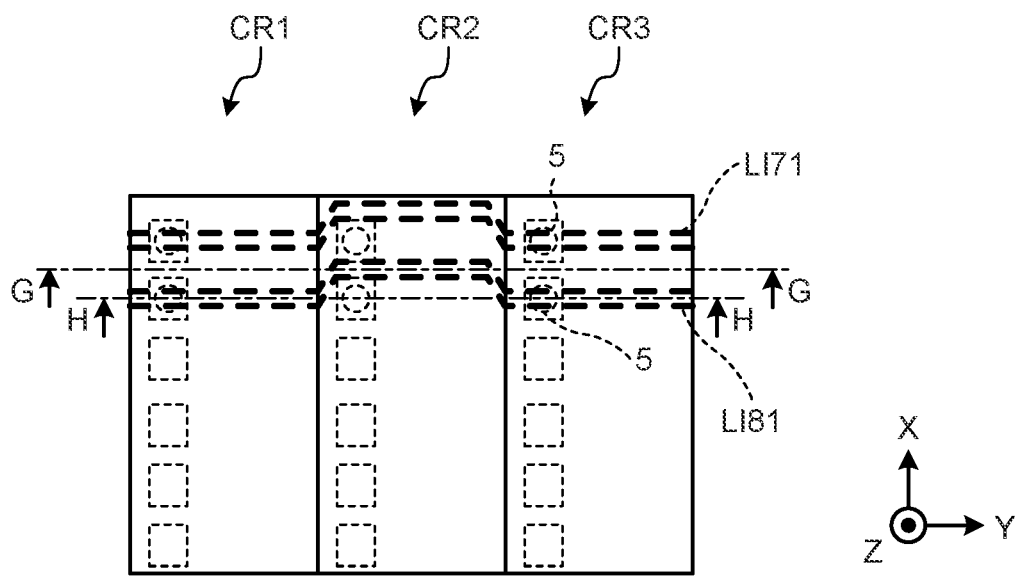
FIG. 8A to FIG. 8C are a plan view and cross-sectional views illustrating the manufacturing method of the semiconductor device according to the first embodiment.
Figure 8B:
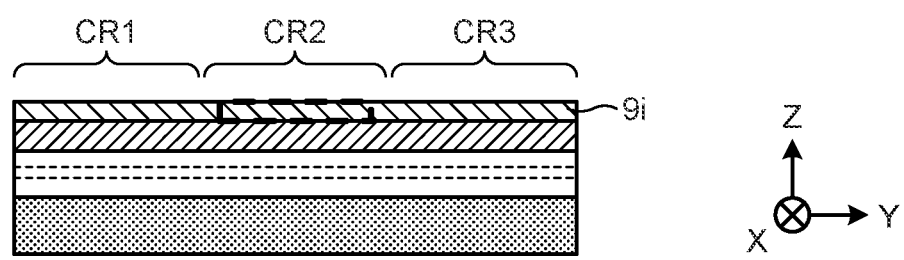
Figure 8C:
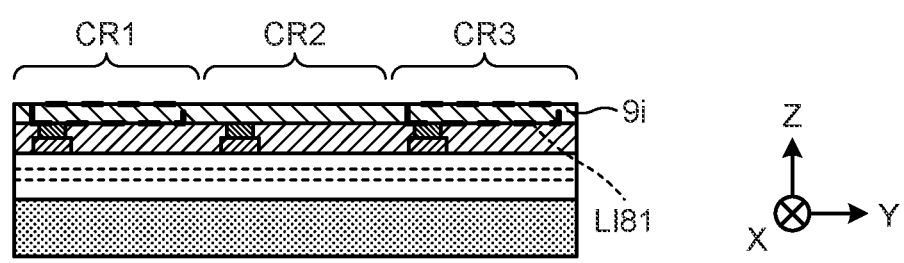

If the exposure target is the chip region CR3, the latent image patterns LI71 and LI81 illustrated in FIG. 8A are formed on the resist 9$i$ as illustrated in FIG. 8C. FIG. 8A to FIG. 8C are a plan view and cross-sectional views illustrating the manufacturing method of the semiconductor device and illustrate, as an example, a case in which the chip region CR3 serving as the exposure target is a non-defective chip region. FIG. 8A is an XY plan view and illustrates, as an example, the latent image patterns LI71 and LI81 which pass through the via conductors 5 of the chip region CR3 when viewed through in the Z-direction. FIG. 8B is a YZ cross-sectional view of a case in which the XY plan view of FIG. 8A is sectioned by a line G-G and illustrates that no latent image pattern is formed in a region between the plural via conductors 5. FIG. 8C is a YZ cross-sectional view of a case in which the XY plan view of FIG. 8A is sectioned by a line H-H and illustrates that, for example, the latent image pattern LI81 is formed in a vicinity region of the via conductor 5.

If the exposure apparatus 103 determines that there is no other chip region to be subjected to exposure (No in S45), the conveyance system 101 conveys the substrate 2 which has undergone exposure to the development apparatus 104. When the substrate 2 is conveyed, the development apparatus 104 subjects the substrate 2 to development (S46). The development apparatus 104 develops the latent image pattern formed on the resist 9$i$ of the substrate 2. As a result, the substrate 2 on which a groove pattern is formed on the resist 9 is obtained.

Figure 9A:
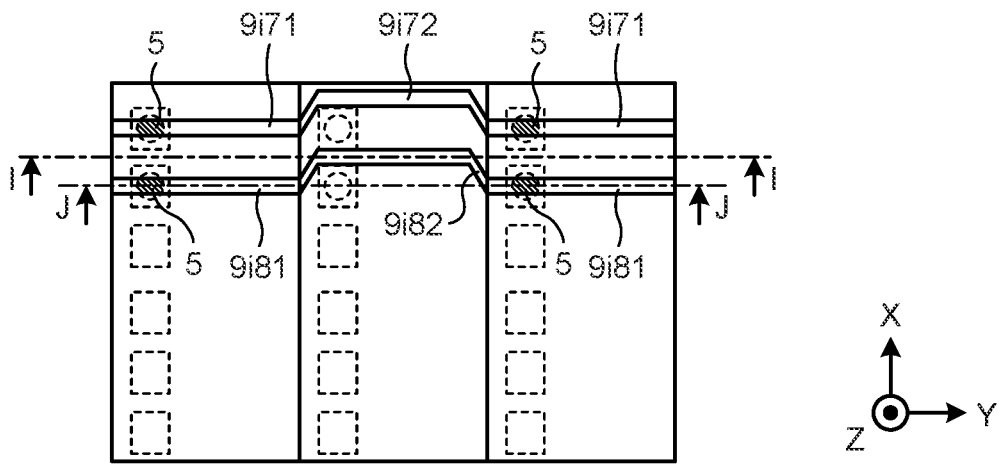
FIG. 9A to FIG. 9C are a plan view and cross-sectional views illustrating the manufacturing method of the semiconductor device according to the first embodiment.
Figure 9B:
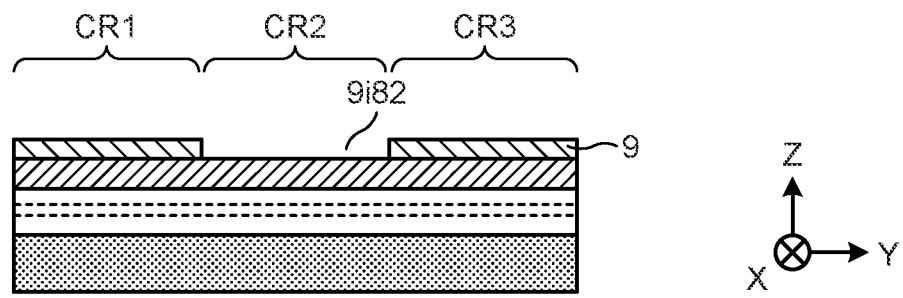
Figure 9C:
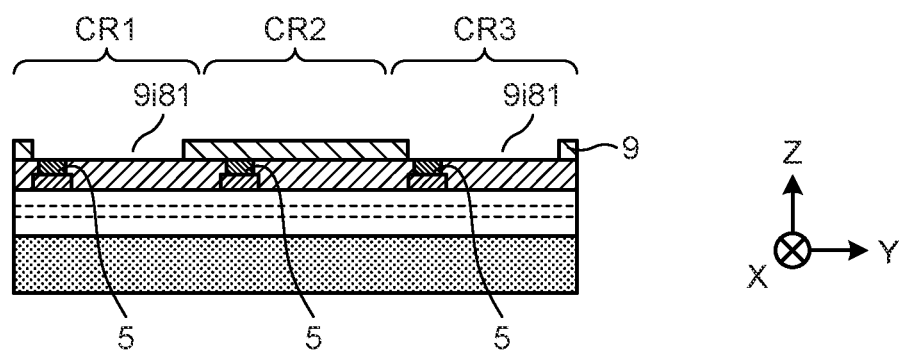

For example, on the substrate 2, groove patterns 9$i$71, 9$i$72, 9$i$81, and 9$i$82 as illustrated in FIG. 9A to FIG. 9C are formed on the resist 9. FIG. 9A to FIG. 9C are a plan view and cross-sectional views illustrating the manufacturing method of the semiconductor device and illustrate, as an example, a case in which the chip region CR2 is a defective chip region and the chip regions CR1 and CR2 are non-defective chip regions. FIG. 9A is an XY plan view and illustrates that the groove patterns 9$i$72 and 9$i$82 are formed in the chip region CR2 and that the groove patterns 9$i$71 and 9$i$81 are formed in the chip regions CR1 and CR2. The groove patterns 9$i$72 and 9$i$82 are groove patterns for defective chip regions and bypass the via conductors 5 of the chip region CR2 when viewed through in the Z-direction. The groove patterns 9$i$72 and 9$i$82 do not expose the +Z-side surfaces of the via conductors 5 of the chip region CR2. The groove patterns 9$i$71 and 9$i$81 are groove patterns for non-defective chip regions and pass through the via conductors 5 of the chip regions CR1 and CR3 when viewed through in the Z-direction. The groove patterns 9$i$71 and 9$i$81 expose the +Z-side surfaces of the via conductors 5 of the chip regions CR1 and CR3. FIG. 9B is a YZ cross-sectional view of a case in which the XY plan view of FIG. 9A is sectioned by a line I-I and illustrates that no groove pattern is formed in a region between the plural via conductors 5. FIG. 9C is a YZ cross-sectional view of a case in which the XY plan view of FIG. 9A is sectioned by a line J-J and illustrates that, for example, the groove pattern 9$i$81 is formed in vicinity regions of the via conductors 5.

When the development (S46) is completed, the conveyance system 101 conveys the substrate 2, on which the groove patterns are formed, from the development apparatus 104 to the film formation apparatus 107.

The film formation apparatus 107 carries out a film formation process of embedding an electrically conductive substance in the groove patterns, for example, by CVD or plating (S47). The electrically conductive substance may be a material which includes a metal such as tungsten, copper, or the like as a main component. As a result, lines which are disposed at the height corresponding to upper ends of the via conductors 5, pass through the via conductors 5 of the non-defective chip regions CR among the plural chip regions CR, and extend so as to bypass the via conductors 5 of the defective chip regions can be formed. More specifically, wiring which is connected to the electrodes 4 of the non-defective chip regions CR among the plural chip regions CR, but is not connected to the electrodes 4 of the defective chip regions CR can be formed. As a result, in the semiconductor device 1 including the plural chip regions CR as one system, if part of the chip regions among the plural chip regions CR is a non-defective chip region, the semiconductor device 1 can be recovered as a non-defective product.

Figure 10A:
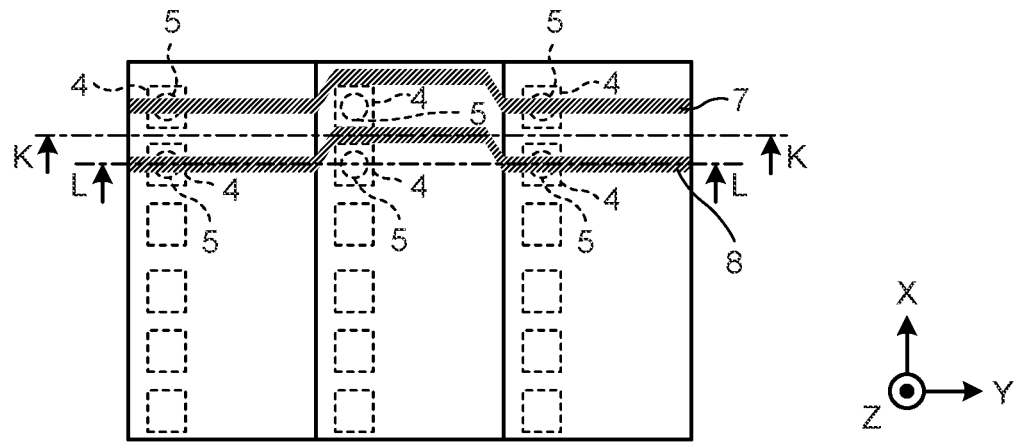
FIG. 10A to FIG. 10C are a plan view and cross-sectional views illustrating the manufacturing method of the semiconductor device according to the first embodiment.
Figure 10B:
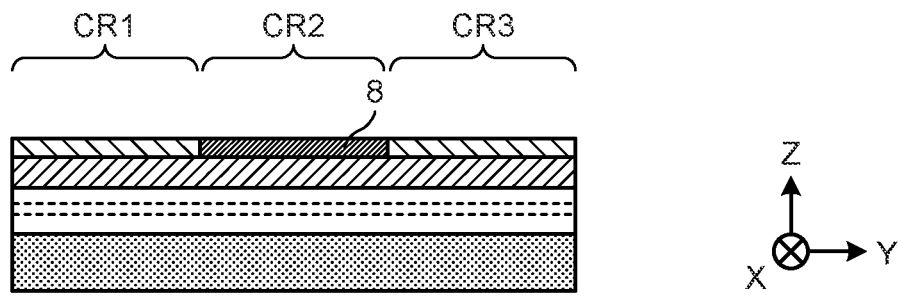
Figure 10C:
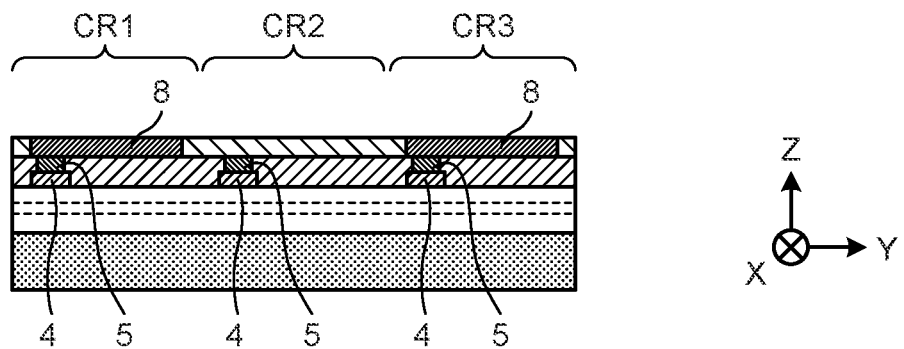

For example, the lines 7 and 8 as illustrated in FIG. 10A to FIG. 10C are formed on the substrate 2. FIG. 10A to FIG. 10C are a plan view and cross-sectional views illustrating the manufacturing method of the semiconductor device and illustrate, as an example, the lines 7 and 8 of a case in which the chip region CR2 is a defective chip region and the chip regions CR1 and CR2 are non-defective chip regions. FIG. 10A is an XY plan view and illustrates, as an example, the lines 7 and 8 which bypass the via conductors 5 of the chip region CR2 and pass through the via conductors 5 of the chip regions CR1 and CR3 when viewed through in the Z-direction. The lines 7 and 8 do not contact the +Z-side surfaces of the via conductors 5 of the chip region CR2, but contact the +Z-side surfaces of the via conductors 5 of the chip regions CR1 and CR3. FIG. 10B is a YZ cross-sectional view of a case in which the XY plan view of FIG. 10A is sectioned by a line K-K and illustrates that the pattern of the line 8 is formed in a region between the plural via conductors 5 in the chip region CR2. FIG. 10C is a YZ cross-sectional view of a case in which the XY plan view of FIG. 10A is sectioned by a line L-L and illustrates that the line 8 is formed in vicinity regions of the via conductors 5 in the chip regions CR1 and CR3.

As described above, in the first embodiment, the substrate 2 on which the plural chip regions CR are arranged in a planar direction is subjected to inspection by each chip region CR, the chip region is determined whether it is a non-defective chip region or a defective chip region, and wiring which is connected to the electrodes 4 of the non-defective chip region CR and not connected to the electrodes 4 of the defective chip region CR is formed. For example, the lines 7 and 8 which are disposed at the height corresponding to the upper ends of the via conductors 5, pass through the via conductors 5 of the non-defective chip region, and extend so as to bypass the via conductors 5 of the defective chip regions are formed. As a result, in the semiconductor device 1 including the plural chip regions CR as one system, if part of the chip regions among the plural chip regions CR is a defective chip region, the semiconductor device 1 can be recovered as a non-defective product. As a result, the manufacturing yield of the semiconductor device 1 can be improved.

Figure 11:
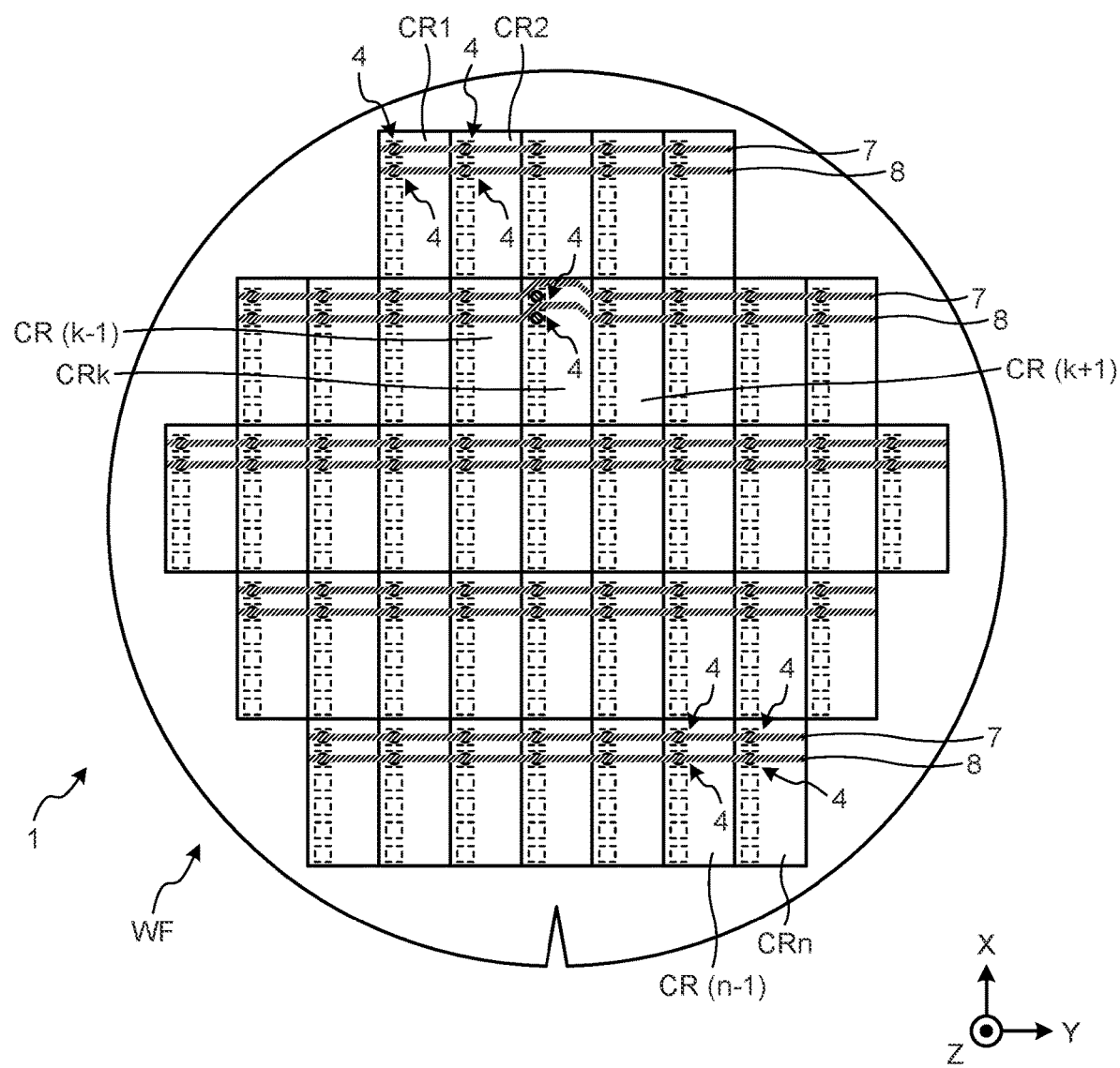
FIG. 11 is a plan view illustrating a system wafer of a first modification example of the first embodiment.

Note that the semiconductor device 1 manufactured by the manufacturing method of the first embodiment may be a system wafer WF as illustrated in FIG. 11. FIG. 11 is a plan view illustrating a system wafer of a first modification example of the first embodiment.

In the system wafer WF, plural chip regions CR1 to CRn (n is an arbitrary integer of 5 or higher) are arranged in the XY planar direction. FIG. 11 illustrates, as an example, a configuration in which the plural chip regions CR1 to CRn are arranged two dimensionally like a matrix. Each chip region CR may be a chip region of a non-volatile memory such as a NAND-type flash memory. In such a case, the system wafer WF may be a wafer level SSD which functions as a solid state drive (SSD) or a memory part thereof as the whole wafer.

FIG. 11 illustrates, as an example, a case in which, among the plural chip regions CR1 to CRn, the chip region CRk (k is an arbitrary integer of 3 or higher which is smaller than n) is determined to be a defective chip region, and the chip regions CR1 to CR(k−1) and CR(k+1) to CRn are determined to be non-defective chip regions. The plural chip regions CR1 to CRn are coupled by the shared line 7. The line 7 is a power line, passes through the electrodes 4 for the power of the non-defective chip regions CR1 to CR(k−1) and CR(k+1) to CRn, and extends so as to bypass the electrodes 4 for the power of the defective chip region CRk. Also, the plural chip regions CR1 to CRn are coupled by the shared line 8. The line 8 is a ground line which passes through the electrodes 4 for the power of the non-defective chip regions CR1 to CR(k−1) and CR(k+1) to CRn and extends so as to bypass the electrodes 4 for the power of the defective chip region CRk. By virtue of this, in the semiconductor device 1 which includes the plural chip regions CR1 to CRn as one system, if the chip region CRk which is part of the plural chip regions CR1 to CRn is a defective chip region, the semiconductor device 1 can be recovered as a non-defective product.

Figure 12:
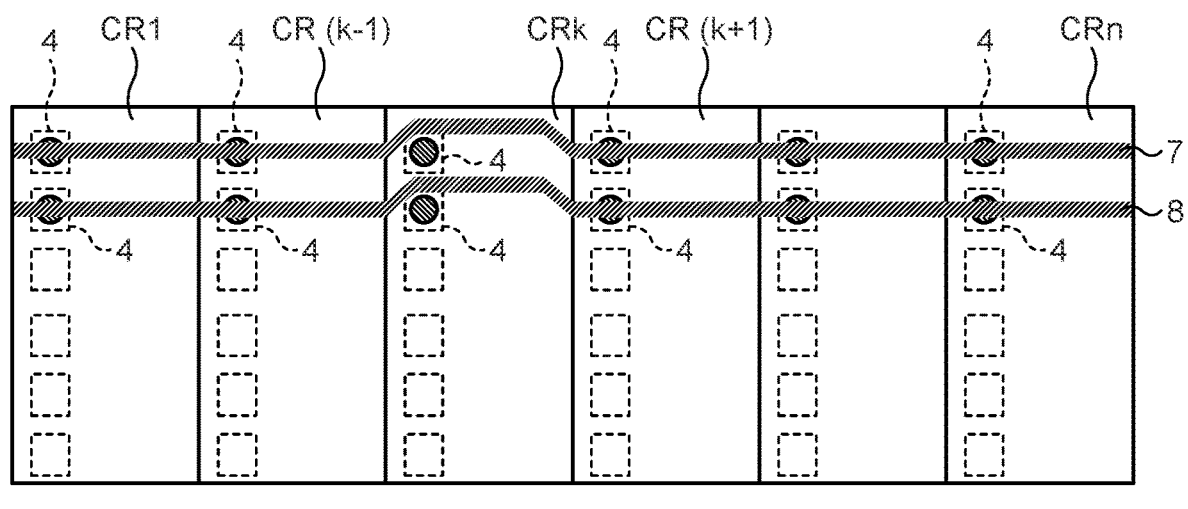
FIG. 12 is a plan view illustrating a system chip of a second modification example of the first embodiment.

Alternatively, the semiconductor device 1 manufactured by the manufacturing method of the first embodiment may be a system chip CH as illustrated in FIG. 12. FIG. 12 is a plan view illustrating the system chip CH of a second modification example of the first embodiment.

In the system chip CH, plural chip regions CR1 to CRn (n is an arbitrary integer of 5 or higher) are arranged in the XY planar direction. FIG. 12 illustrates, as an example, a configuration in which the plural chip regions CR1 to CRn are arranged in the Y-direction. Each chip region CR may be a chip region of a non-volatile memory such as a NAND-type flash memory. In such a case, the system chip CH may be SSD on-chip which functions as a solid state drive (SSD) or a memory part thereof as the whole chip.

FIG. 12 illustrates, as an example, a case in which, among the plural chip regions CR1 to CRn, the chip region CRk (k is an arbitrary integer of 3 or higher which is smaller than n) is determined to be a defective chip region, and the chip regions CR1 to CR(k−1) and CR(k+1) to CRn are determined to be non-defective chip regions. The plural chip regions CR1 to CRn are coupled by the shared line 7. The line 7 is a power line passes through the electrodes 4 for the power of the non-defective chip regions CR1 to CR(k−1) and CR(k+1) to CRn and extends so as to bypass the electrodes 4 for the power of the defective chip region CRk. Also, the plural chip regions CR1 to CRn are coupled by the shared line 8. The line 8 is a ground line which passes through the electrodes 4 for the power of the non-defective chip regions CR1 to CR(k−1) and CR(k+1) to CRn and extends so as to bypass the electrodes 4 for the power of the defective chip region CRk. By virtue of this, in the semiconductor device 1 which includes the plural chip regions CR1 to CRn as one system, if the chip region CRk which is part of the plural chip regions CR1 to CRn is a defective chip region, the semiconductor device 1 can be recovered as a non-defective product.

Second Embodiment

Next, a manufacturing method of a semiconductor device according to a second embodiment will be described. Hereinafter, the part that is different from the first embodiment will be mainly described.

The first embodiment has shown, as an example, the method in which the wiring which is not connected to the electrodes of defective chip regions is formed by forming the line that bypasses the electrodes of the defective chips. However, the second embodiment shows, as an example, a method of forming wiring which is not connected to the electrodes of defective chip regions by not forming via conductors on the electrodes of defective chips.

Specifically, the semiconductor device 1 can be manufactured as illustrated in FIG. 13A to FIG. 13D. FIG. 13A to FIG. 13D are plan views and cross-sectional views illustrating outlines of the manufacturing method of the semiconductor device 1 according to the second embodiment. FIG. 13A and FIG. 13C are XY plan views illustrating the outlines of the manufacturing method of the semiconductor device 1. FIG. 13B and FIG. 13D are YZ cross-sectional views illustrating the outlines of the manufacturing method of the semiconductor device 1 and illustrate the cross sections of the cases in which FIG. 13A and FIG. 13C are sectioned by a line M-M and a line N-N, respectively.

In manufacturing of the semiconductor device 1, the points that the device structures 3 are formed on the substrate 2, the electrodes 4 are formed on the device structures 3, and then an inspection such as an operation test is carried out as illustrated in FIG. 13A and FIG. 13B are the same as the first embodiment. FIG. 13A and FIG. 13B illustrate, as an example, a case in which the chip region CR2 is determined to be a defective chip region, and the chip regions CR1 and CR3 are determined to be non-defective chip regions.

As illustrated in FIG. 13C and FIG. 13D, the inspection results are subjected to feed-forward, and the layout of the via conductors 5 to be formed thereafter is changed. For example, the via conductors 5 are formed on the electrodes of non-defective chip regions among the plural chip regions, and the via conductors 5 are not formed on the electrodes of defective chip regions. FIG. 13C and FIG. 13D illustrate, as an example, a layout in which the via conductors 5 are formed on the electrodes 4 of the non-defective chip regions CR1 and CR3, and the via conductors 5 are not formed on the electrodes 4 of the defective chip region CR2. As a result, when the lines 7 and 8 which pass through the electrodes 4 of the chip regions CR1, CR2, and CR3 when viewed through the Z-direction are formed thereafter, wiring in which the lines 7 and 8 are connected to the electrodes 4 of the non-defective chip regions CR1 and CR3, and the lines 7 and 8 are not connected to the electrodes 4 of the defective chip region CR2 is formed. The line 7 is, for example, a power line, and the line 8 is, for example, a ground line.

Figure 14:
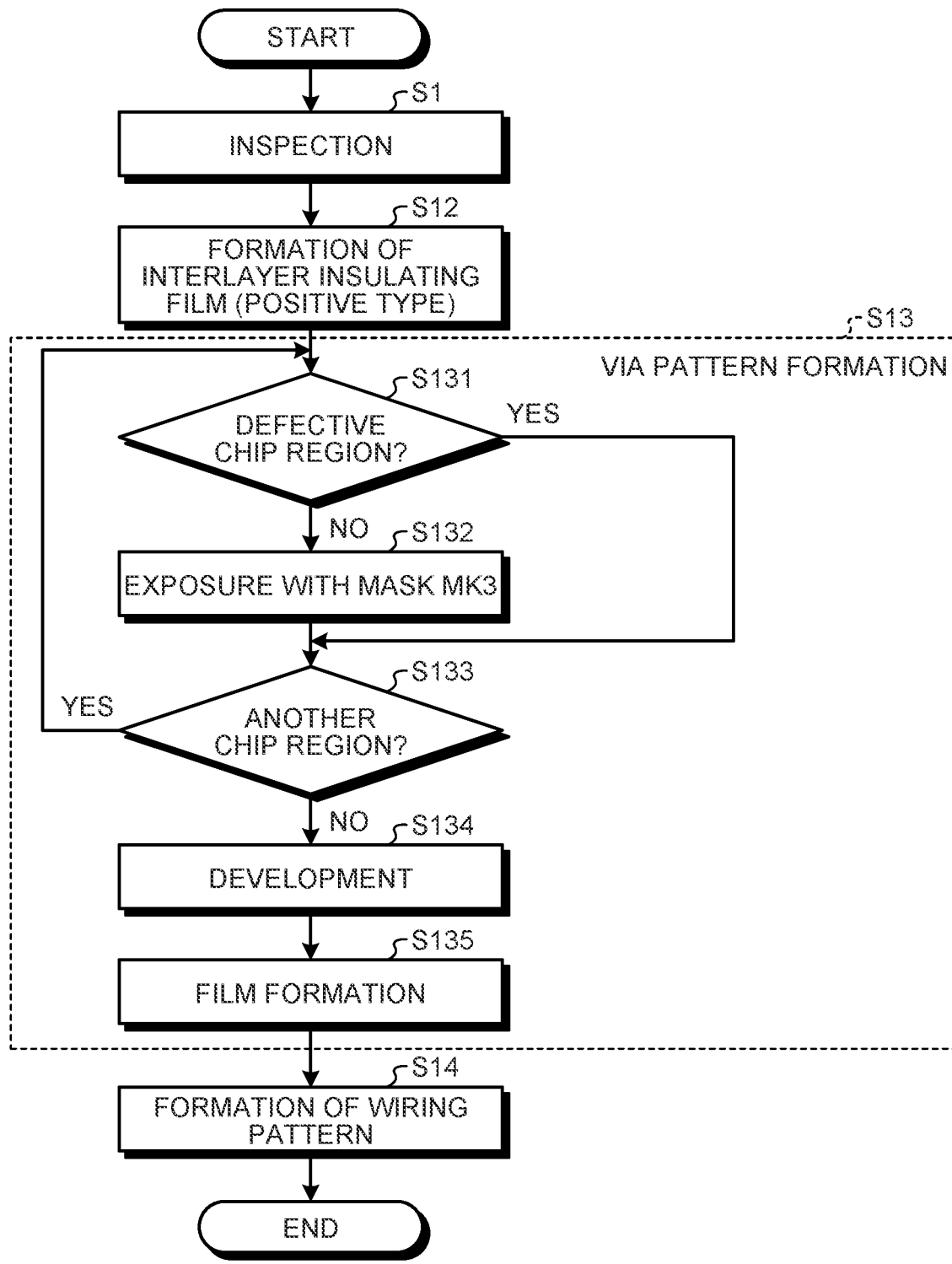
FIG. 14 is a flow chart illustrating the manufacturing method of the semiconductor device according to the second embodiment.

More specifically, the semiconductor device 1 can be manufactured as illustrated in FIG. 14 by using the semiconductor manufacturing system 100 illustrated in FIG. 2. FIG. 14 is a flow chart illustrating a manufacturing method of the semiconductor device 1.

When an inspection (S1) is carried out like the first embodiment and is completed, an interlayer insulating film 16i is formed with a positive-type photosensitive material (S12). The conveyance system 101 conveys the substrate 2 from the inspection apparatus 108 to the application apparatus 102. When the substrate 2 is placed on the stage of the application apparatus 102, the application apparatus 102 applies an insulating material to the substrate 2. The insulating material is a solution which is to serve as the interlayer insulating film 6i and can be formed of a positive-type photosensitive material. The positive-type photo-sensitive material includes a novolac-based resin, a polyimide (PI) resin, etc.

Figure 15A:
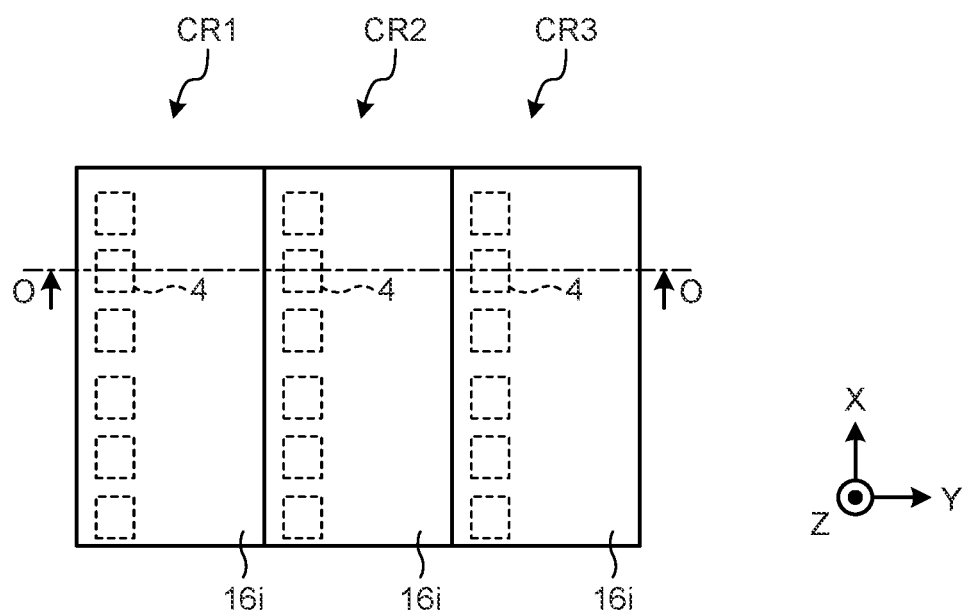
FIG. 15A and FIG. 15B are a plan view and a cross-sectional view illustrating the manufacturing method of the semiconductor device according to the second embodiment.
Figure 15B:
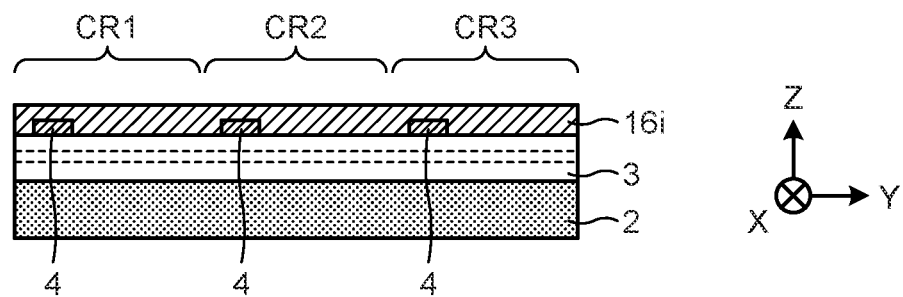

As a result, as illustrated in FIG. 15A to FIG. 15B, the interlayer insulating film 16i which covers the device structures 3 and the electrodes 4 of the chip regions CR1 to CR3 is formed. FIG. 15A to FIG. 15B are a plan view and a cross-sectional view illustrating the manufacturing method of the semiconductor device. FIG. 15A is an XY plan view and illustrates that the interlayer insulating film 16i which covers the device structures 3 and the electrodes 4 in the chip regions CR is formed. FIG. 15B is a YZ cross-sectional view of a case in which the XY plan view of FIG. 15A is sectioned by a line O-O and illustrates that the interlayer insulating film 16i which covers the device structures 3 and the electrodes 4 in the chip regions CR is formed.

When the interlayer insulating film 16i is formed, the conveyance system 101 conveys the substrate 2 from the application apparatus 102 to the exposure apparatus 103.

Then, a pattern of the via conductors 5 is formed (S13). Specifically, the processes of S131 to S135 are carried out.

The host controller 109 acquires layout data for a non-defective chip region as layout data for a processing target layer (in other words, the interlayer insulating film 16i). The layout data for the non-defective chip region includes the pattern of the via conductors 5 at the positions corresponding to the electrodes 4 of the non-defective chip regions and does not include the pattern of the via conductors 5 at the positions corresponding to the electrodes 4 of the defective chip region.

In the exposure apparatus 103, the conveyed substrate 2 is set on the substrate stage. The exposure apparatus 103 acquires the inspection result information of the substrate 2. The inspection result information may be acquired from the host controller 109 via a communication line or may be acquired by directly inputting to the exposure apparatus 103. When the exposure apparatus 103 determines a chip region serving as an exposure target among the plural chip regions of the substrate 2, the exposure apparatus 103 references the inspection result information and determines whether the chip region serving as the exposure target is a defective chip region or not (S131).

If the chip region serving as the exposure target is a non-defective chip region (No in S131), the exposure apparatus 103 carries out a following operation. If a mask is not set on the mask stage, the exposure apparatus 103 sets a mask MK3 for a non-defective chip region on the mask stage. If the mask MK3 is set on the mask stage, the exposure apparatus 103 maintains this state. The exposure apparatus 103 subjects the interlayer insulating film 16i above the substrate 2 with the mask MK3 (S132). The exposure apparatus 103 illuminates the mask MK3 on the mask stage with the illumination optical system and projects the illumination light thereof to the substrate 2 on the substrate stage with the projection optical system to subject the substrate 2 to exposure. As a result, a latent image pattern corresponding to the mask data for the non-defective chip region is formed on the interlayer insulating film 16i.

If the chip region serving as the exposure target is a defective chip region (Yes in S131), the exposure apparatus 103 does not carry out exposure of the chip region.

Figure 16A:
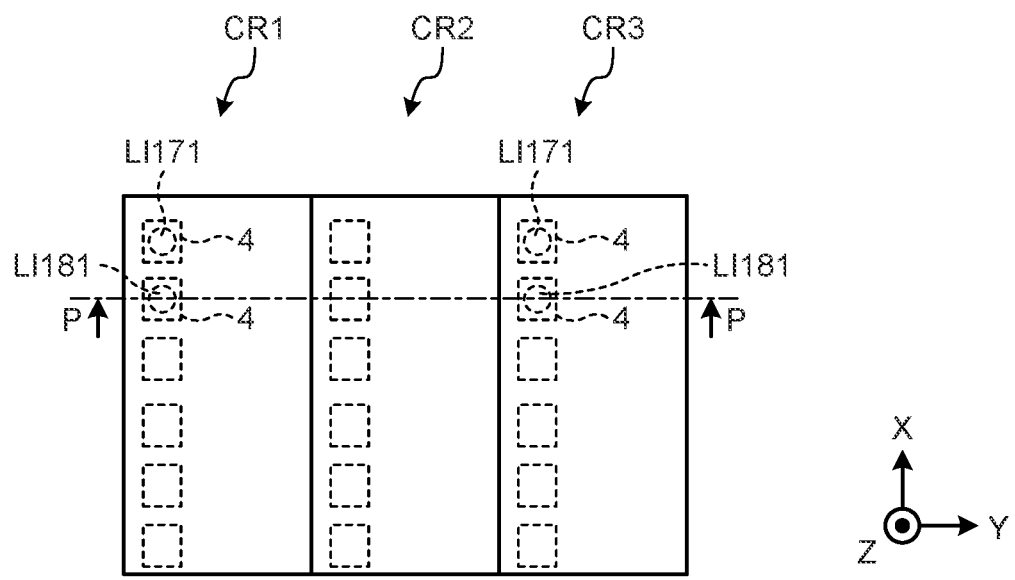
FIG. 16A and FIG. 16B are a plan view and a cross-sectional view illustrating the manufacturing method of the semiconductor device according to the second embodiment.
Figure 16B:
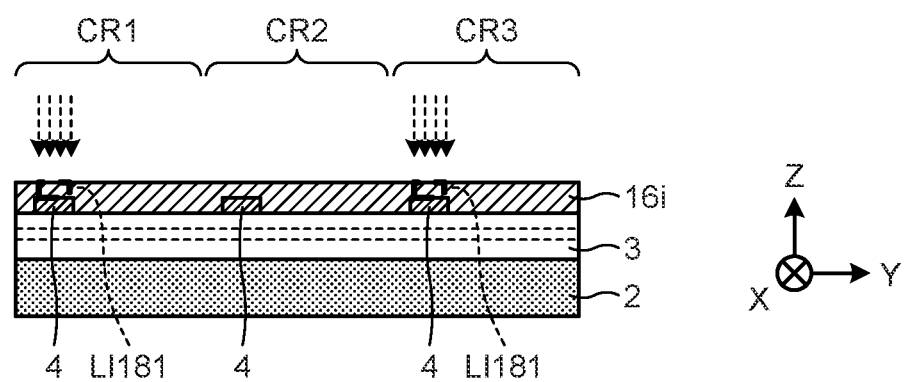

For example, if the exposure target is the chip region CR1, latent image patterns LI171 and LI181 illustrated in FIG. 16A and FIG. 16B are formed in the part of the chip region CR1 in the interlayer insulating film 16i by using the mask MK3 for the non-defective chip region. FIG. 16A and FIG. 16B are a plan view and a cross-sectional view illustrating the manufacturing method of the semiconductor device and illustrate, as an example, a case in which the chip region CR1 serving as the exposure target is a non-defective chip region. FIG. 16A is an XY plan view and illustrates, as an example, the latent image patterns LI171 and LI181 which are overlapped with the electrodes 4 of the chip region CR1 when viewed through in the Z-direction. FIG. 16B is a YZ cross-sectional view of a case in which the XY plan view of FIG. 16A is sectioned by a line P-P and illustrates that the latent image pattern LI181 is formed on the electrodes 4 of the chip region CR1.

If the exposure target is the chip region CR2, the exposure process is skipped, and the latent image pattern is not formed.

If the exposure target is the chip region CR3, the latent image patterns LI171 and LI181 illustrated in FIG. 16A are formed on the interlayer insulating film 16i. FIG. 16A illustrates, as an example, the latent image patterns LI171 and LI181 which are overlapped with the electrodes 4 of the chip region CR3 when viewed through in the Z-direction. FIG. 16B illustrates that the latent image pattern LI181 is formed on the electrodes 4 of the chip region CR3.

When the exposure apparatus 103 determines that another chip region to be subjected to exposure is present (Yes in S133), the exposure apparatus 103 returns the process to S131. When the exposure apparatus 103 determines that no other chip region to be subjected to exposure is present (No in S133), the conveyance system 101 conveys the substrate 2 after the exposure to the development apparatus 104. When the substrate 2 is conveyed, the development apparatus 104 subjects the substrate 2 to development (S134). The development apparatus 104 develops the latent image patterns formed on the interlayer insulating film 16i of the substrate 2. As a result, the substrate 2 on which a hole pattern 161 is selectively formed on the part of the non-defective chip regions of the interlayer insulating film 16 is obtained.

Figure 17A:
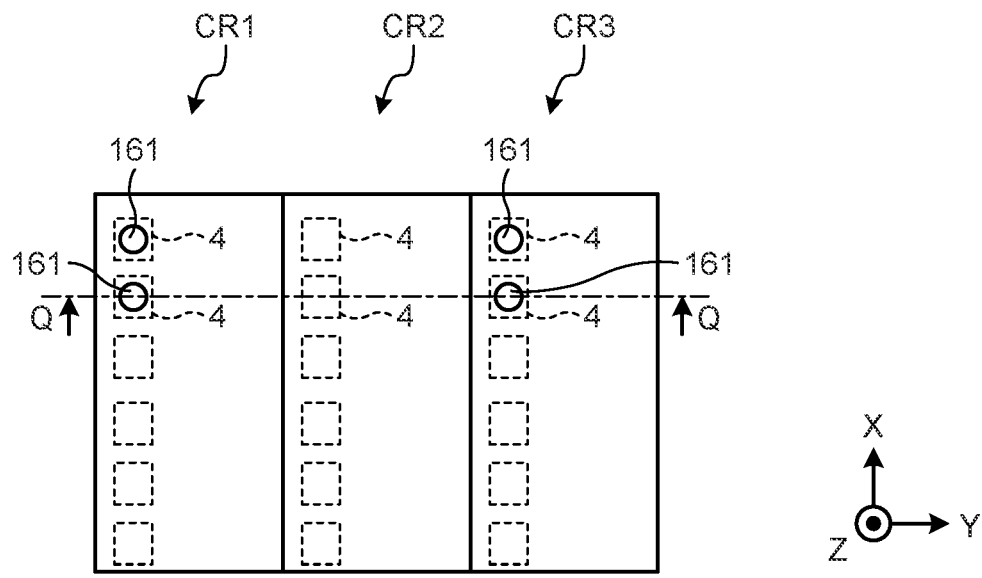
FIG. 17A and FIG. 17B are a plan view and a cross-sectional view illustrating the manufacturing method of the semiconductor device according to the second embodiment.
Figure 17B:
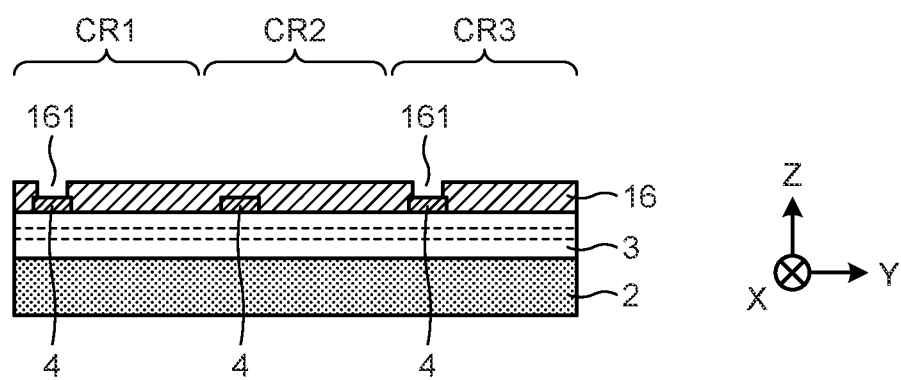

For example, the hole pattern 161 as illustrated in FIG. 17A and FIG. 17B is formed on the interlayer insulating film 16. FIG. 17A and FIG. 17B are a plan view and a cross-sectional view illustrating the manufacturing method of the semiconductor device and illustrate, as an example, a case in which the chip region CR2 is a defective chip region, and the chip regions CR1 and CR3 are non-defective chip regions. FIG. 17A is an XY plan view and illustrates that the hole pattern overlapped with the electrodes 4 of the chip region CR2 is not formed and that the hole pattern 161 overlapped with the electrodes 4 of the chip regions CR1 and CR3 is formed. FIG. 17B is a YZ cross-sectional view of a case in which the XY plan view of FIG. 17A is sectioned by a line Q-Q and illustrates that the hole pattern is not formed on the electrodes 4 of the chip region CR2 and that the hole pattern 161 is formed on the electrodes 4 of the chip regions CR1 and CR3.

When the development (S134) is completed, the conveyance system 101 conveys the substrate 2, on which the hole pattern is formed, from the development apparatus 104 to the film formation apparatus 107.

The film formation apparatus 107 carries out a film formation process of embedding an electrically conductive substance in the hole pattern, for example, by CVD or plating (S135). The electrically-conductive substance may be a material which includes metal such as tungsten or copper as a main component. As a result, the via conductors 5 which are disposed at the height corresponding to the upper ends of the electrodes 4 and are overlapped with the electrodes 4 of the non-defective chip regions CR among the plural chip regions CR are formed, and formation of the via conductors 5 overlapped with the electrodes 4 of the defective chip region can be avoided.

Figure 18A:
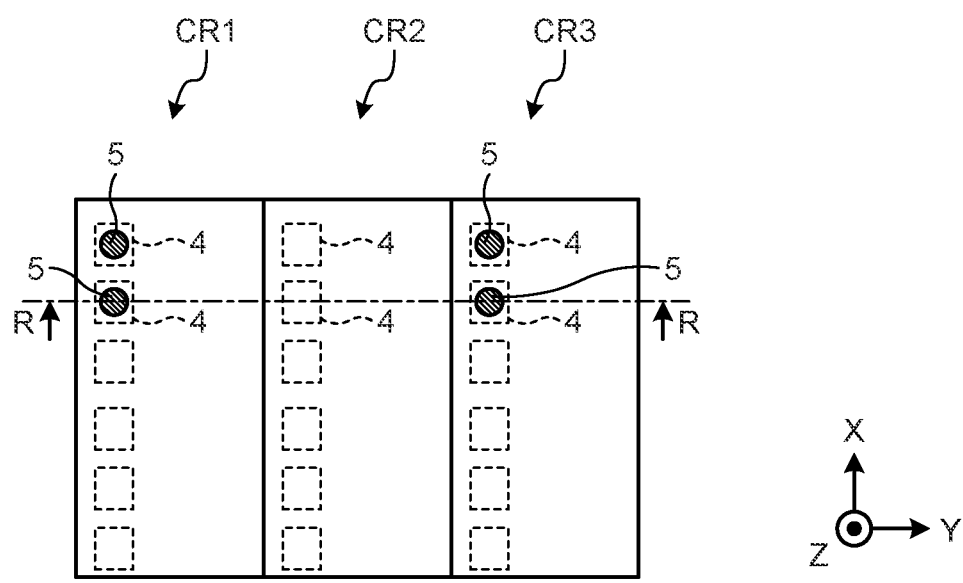
FIG. 18A and FIG. 18B are a plan view and a cross-sectional view illustrating the manufacturing method of the semiconductor device according to the second embodiment.
Figure 18B:
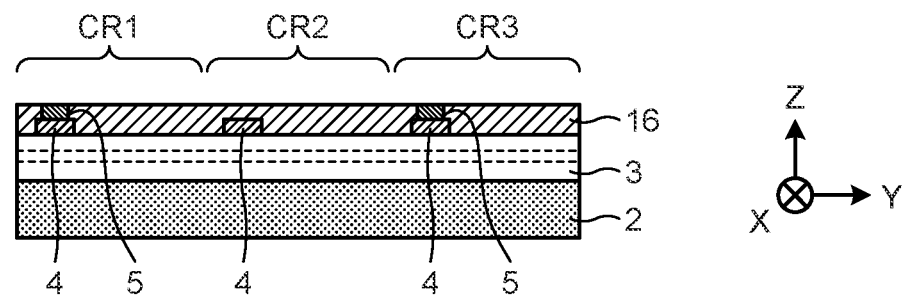

For example, the via conductors 5 as illustrated in FIG. 18A and FIG. 18B are formed on the substrate 2. FIG. 18A and FIG. 18B are a plan view and a cross-sectional view illustrating the manufacturing method of the semiconductor device and illustrate, as an example, the via conductors 5 of a case in which the chip region CR2 is a defective chip region, and the chip regions CR1 and CR2 are non-defective chip regions. FIG. 18A is an XY plan view and illustrates that the via conductors overlapped with the electrodes 4 of the chip region CR2 are not formed and that the via conductors 5 overlapped with the electrodes 4 of the chip regions CR1 and CR2 are formed. FIG. 18B is a YZ cross-sectional view of a case in which the XY plan view of FIG. 18A is sectioned by a line R-R and illustrates that the via conductors are not formed on the electrodes 4 of the chip region CR2 and that the via conductors 5 are formed on the electrodes 4 of the chip regions CR1 and CR3.

Then, a wiring pattern is formed (S14). The conveyance system 101 conveys the substrate 2 from the film formation apparatus 107 to the application apparatus 102. When the substrate 2 is placed on the stage of the application apparatus 102, the application apparatus 102 applies an insulating material which includes, for example, a positive-type photosensitive material or a negative-type photosensitive material to the substrate 2. When the application is completed, the conveyance system 101 conveys the substrate 2 from the application apparatus 102 to the exposure apparatus 103. In the exposure apparatus 103, the conveyed substrate 2 is set on the substrate stage, and the resist 9i above the substrate 2 is subjected to exposure with the mask MK1. As a result, a latent image pattern corresponding to the mask data is formed on the resist 9i. When the exposure process is completed, the conveyance system 101 conveys the substrate 2 after the exposure to the development apparatus 104. When the substrate 2 is conveyed, the development apparatus 104 subjects the substrate 2 to development. The development apparatus 104 develops the latent image pattern formed on the resist 9i of the substrate 2. As a result, the substrate 2 on which the groove pattern is formed on the resist 9 is obtained. When the development is completed, the conveyance system 101 conveys the substrate 2, on which the groove pattern is formed, from the development apparatus 104 to the film formation apparatus 107. The film formation apparatus 107 carries out a film formation process of embedding an electrically conductive substance in the groove pattern, for example, by CVD or plating.

As a result, as illustrated in FIG. 13C and FIG. 13D, the lines 7 and 8 which are disposed at the height corresponding to the upper ends of the via conductors 5 and pass through the upper side of the electrodes 4 of the chip regions CR can be formed. The lines 7 and 8 are connected to the electrodes 4 via the via conductors 5 in the non-defective chip regions and are insulated from the electrodes 4 via the interlayer insulating film 6 in the defective chip region. In other words, wiring which is connected to the electrodes 4 of the non-defective chip regions CR among the plural chip regions CR and is not connected to the electrodes 4 of the defective chip region CR can be formed. By virtue of this, in the semiconductor device 1 including the plural chip regions CR as one system, if the chip region CR which is part of the plural chip regions CR is a defective chip region, the semiconductor device 1 can be recovered as a non-defective product.

As described above, in the second embodiment, the via conductors 5 are formed on the electrodes 4 of the non-defective chip regions, and the via conductors 5 are not formed on the electrodes 4 of the defective chip region. Then, the lines 7 and 8 which are disposed at the height corresponding to the upper ends of the via conductors 5 and extend so as to pass through the via conductors 5 of the non-defective chip regions are formed. Also by virtue of this, the wiring which is connected to the electrodes 4 of the non-defective chip regions CR and is not connected to the electrodes 4 of the defective chip region CR can be formed.

Third Embodiment

Next, a manufacturing method of a semiconductor device according to a third embodiment will be described. Hereinafter, the parts different from the first embodiment and the second embodiment will be mainly described.

The second embodiment has shown, as an example, the method in which via conductors are not formed on the electrodes of defective chips in the case in which the interlayer insulating film is a positive-type photosensitive material. On the other hand, the third embodiment shows, as an example, a method in which via conductors are not formed on the electrodes of defective chips in a case in which the interlayer insulating film is a negative-type photosensitive material.

Figure 19:
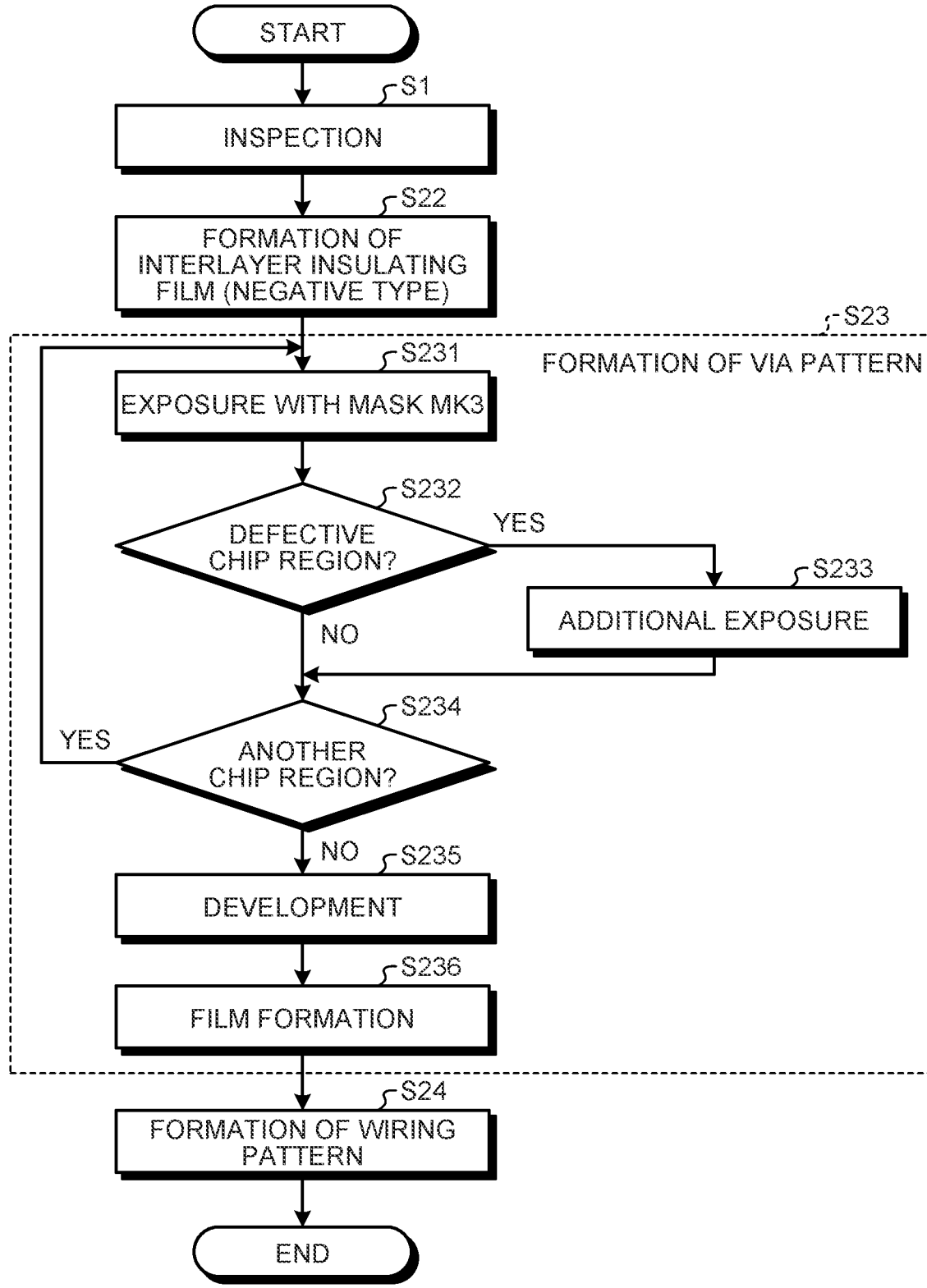
FIG. 19 is a flow chart illustrating a manufacturing method of a semiconductor device according to a third embodiment.

Specifically, the semiconductor device 1 can be manufactured as illustrated in FIG. 19 by using the semiconductor manufacturing system 100 illustrated in FIG. 2. FIG. 19 is a flow chart illustrating the manufacturing method of the semiconductor device 1.

When an inspection (S1) is carried out like the first embodiment and is completed, the interlayer insulating film 16i is formed with a negative-type photosensitive material (S22). The conveyance system 101 conveys the substrate 2 from the inspection apparatus 108 to the application apparatus 102. When the substrate 2 is placed on the stage of the application apparatus 102, the application apparatus 102 applies an insulating material to the substrate 2. The insulating material is a solution which is to serve as the interlayer insulating film 16i and can be formed of a negative-type photosensitive material. The negative-type photosensitive material includes a rubber-based resin, an acrylic resin, etc. As a result, the interlayer insulating film 16i which covers the device structures 3 and the electrodes 4 of the chip regions CR1 to CR3 are formed.

When the interlayer insulating film 16i is formed, the conveyance system 101 conveys the substrate 2 from the application apparatus 102 to the exposure apparatus 103.

Then, a pattern of the via conductors 5 is formed (S23). Specifically, the processes of S231 to S236 are carried out.

The host controller 109 acquires layout data for a non-defective chip region as layout data for a processing target layer (in other words, the interlayer insulating film 16i). The layout data for the non-defective chip region includes the pattern of the via conductors 5 at the positions corresponding to the electrodes 4 of the non-defective chip regions and does not include the pattern of the via conductors 5 at the positions corresponding to the electrodes 4 of defective chip regions.

In the exposure apparatus 103, the conveyed substrate 2 is set on the substrate stage. If the mask is not set on the mask stage, the exposure apparatus 103 sets the mask MK3 for non-defective chip regions on the mask stage. If the mask MK3 is set on the mask stage, the exposure apparatus 103 maintains this state. The exposure apparatus 103 subjects the interlayer insulating film 16i above the substrate 2 with the mask MK3 (S231). The exposure apparatus 103 illuminates the mask MK3 on the mask stage with the illumination optical system and projects the illumination light thereof to the substrate 2 on the substrate stage with the projection optical system to subject the substrate 2 to exposure. As a result, a latent image pattern corresponding to the mask data for non-defective chip regions is formed on the interlayer insulating film 16i.

The exposure apparatus 103 acquires the inspection result information of the substrate 2. The inspection result information may be acquired from the host controller 109 via a communication line or may be acquired by directly inputting to the exposure apparatus 103. When the exposure apparatus 103 determines a chip region serving as an exposure target among the plural chip regions of the substrate 2, the exposure apparatus 103 references the inspection result information and determines whether the chip region serving as the exposure target is a defective chip region or not (S232).

If the chip region serving as the exposure target is a defective chip region (Yes in S232), the exposure apparatus 103 carries out additional exposure of the chip region (S233). The exposure apparatus 103 sets a mask blank on the mask stage. The exposure apparatus 103 subjects the interlayer insulating film 16i above the substrate 2 with the mask blank. The exposure apparatus 103 illuminates the mask MK3 on the mask stage with the illumination optical system and projects the illumination light thereof to the substrate 2 on the substrate stage with the projection optical system to subject the substrate 2 to exposure. As a result, on the interlayer insulating film 16i, the defective chip region is subjected to full-surface exposure, and the latent image pattern is cancelled out.

If the chip region serving as the exposure target is a non-defective chip region (No in S232), the exposure apparatus 103 does not carry out additional exposure of the chip region.

Figure 20A:
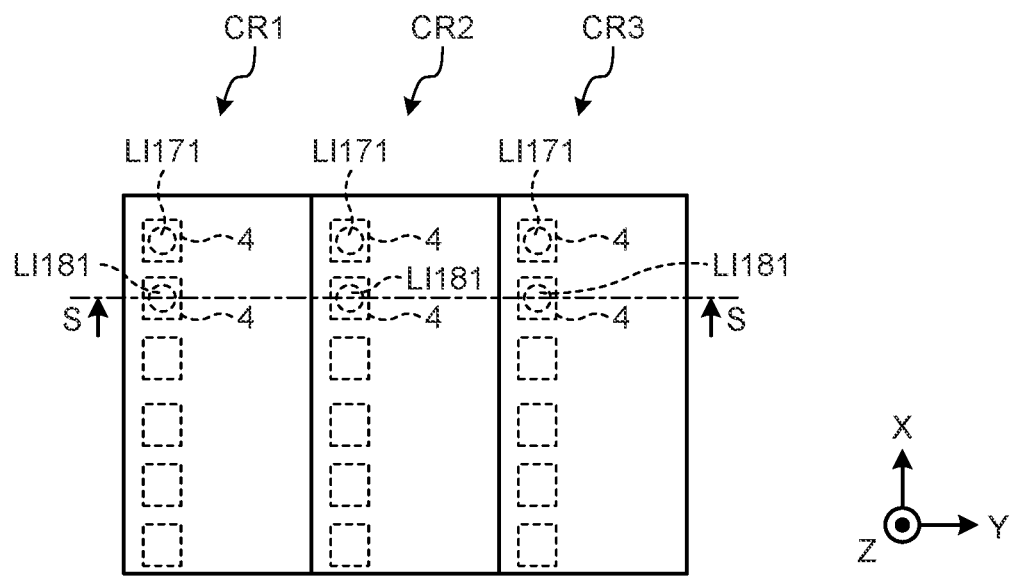
FIG. 20A and FIG. 20B are a plan view and a cross-sectional view illustrating the manufacturing method of the semiconductor device according to the third embodiment.
Figure 20B:
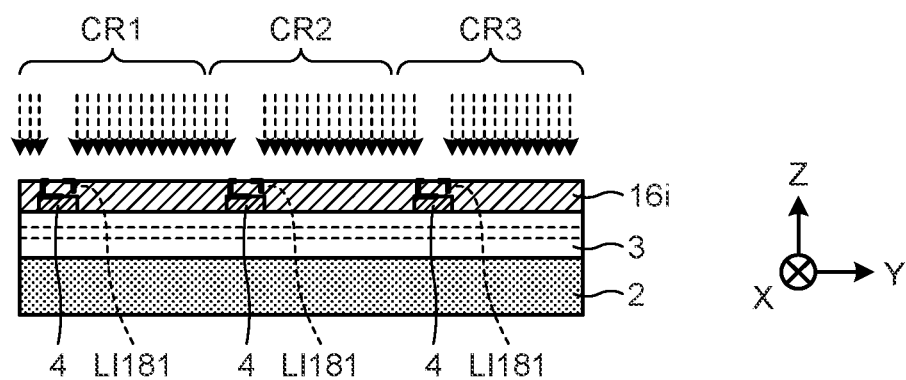

For example, if the exposure target is the chip region CR1, the latent image patterns LI171 and LI181 illustrated in FIG. 20A and FIG. 20B are formed on the chip-region-CR1 part of the interlayer insulating film 16i by using the mask MK3 for non-defective chip regions. FIG. 20A and FIG. 20B are a plan view and a cross-sectional view illustrating the manufacturing method of the semiconductor device and illustrates, as an example, a case in which the chip region CR1 serving as the exposure target is a non-defective chip region. FIG. 20A is an XY plan view and illustrates, as an example, the latent image patterns LI171 and LI181 which are overlapped with the electrodes 4 of the chip region CR1 when viewed through in the Z-direction. FIG. 20B is a YZ cross-sectional view of a case in which the XY plan view FIG. 20A is sectioned by a line S-S and illustrates that the latent image pattern LI181 is formed on the electrodes 4 of the chip region CR1.

Figure 21A:
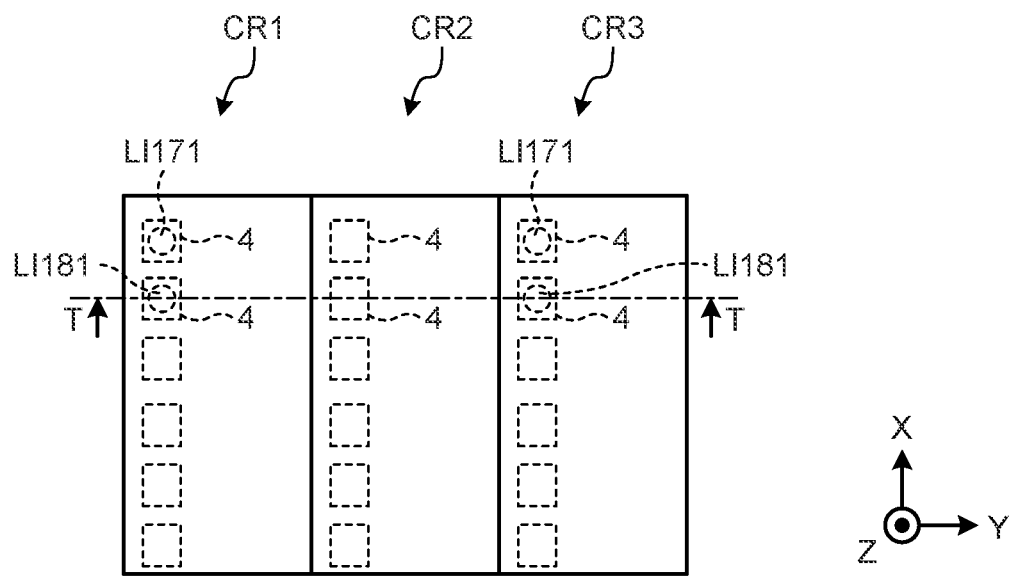
FIG. 21A and FIG. 21B are a plan view and a cross-sectional view illustrating the manufacturing method of the semiconductor device according to the third embodiment.
Figure 21B:
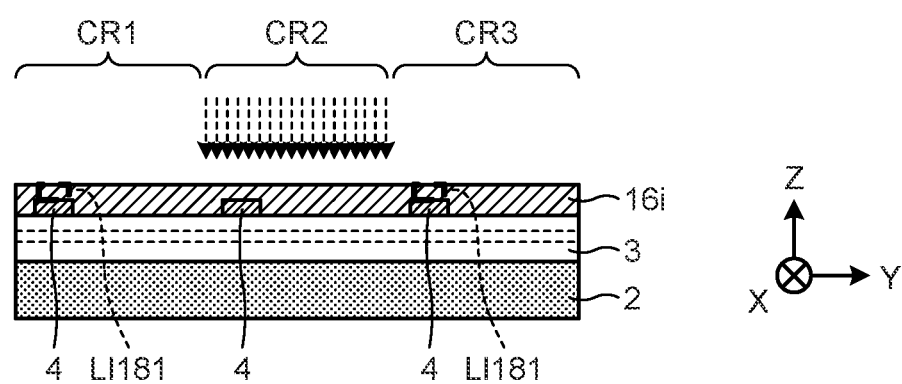

Then, as illustrated in FIG. 21A and FIG. 21B, additional exposure is not carried out. FIG. 21A is an XY plan view and illustrates that the latent image patterns LI171 and LI181 are maintained in the chip region CR1. FIG. 21B is a YZ cross-sectional view of a case in which the XY plan view of FIG. 21A is sectioned by a line T-T and illustrates that the latent image pattern LI181 on the electrodes 4 of the chip region CR1 is maintained.

If the exposure target is the chip region CR2, the latent image patterns LI171 and LI181 illustrated in FIG. 20A and FIG. 20B are formed in the chip-region-CR2 part of the interlayer insulating film 16i by using the mask MK3 for non-defective chip regions. FIG. 20A illustrates, as an example, the latent image patterns LI171 and LI181 which are overlapped with the electrodes 4 of the chip region CR2 when viewed through in the Z-direction. FIG. 20B illustrates that the latent image pattern LI181 is formed on the electrodes 4 of the chip region CR2.

Then, as illustrated in FIG. 21A and FIG. 21B, additional exposure is carried out. FIG. 21A illustrates that chip region CR2 is subjected to full-surface exposure as additional exposure and that the latent image patterns LI171 and LI181 are removed. FIG. 21B illustrates that the latent image pattern LI181 on the electrodes 4 of the chip region CR2 is removed.

If the exposure target is the chip region CR3, the latent image patterns LI171 and LI181 illustrated in FIG. 20A and FIG. 20B are formed in the chip-region-CR1 part of the interlayer insulating film 16i by using the mask MK3 for non-defective chip regions. FIG. 20A illustrates, as an example, the latent image patterns LI171 and LI181 which are overlapped with the electrodes 4 of the chip region CR1 when viewed through in the Z-direction. FIG. 20B illustrates that the latent image pattern LI181 is formed on the electrodes 4 of the chip region CR3.

Then, as illustrated in FIG. 21A and FIG. 21B, additional exposure is not carried out. FIG. 21A illustrates that the latent image patterns LI171 and LI181 are maintained in the chip region CR3. FIG. 21B illustrates that the latent image pattern LI181 on the electrodes 4 of the chip region CR3 is maintained.

When the exposure apparatus 103 determines that another chip region to be subjected to exposure is present (Yes in S234), the exposure apparatus 103 returns the process to S231. When the exposure apparatus 103 determines that no other chip region to be subjected to exposure is present (No in S234), the conveyance system 101 conveys the substrate 2 after the exposure to the development apparatus 104. When the substrate 2 is conveyed, the development apparatus 104 subjects the substrate 2 to development (S235). The development apparatus 104 develops the latent image pattern formed on the interlayer insulating film 16i of the substrate 2. As a result, the substrate 2 on which the hole pattern 161 is selectively formed on the part of the non-defective chip region of the interlayer insulating film 16 is obtained.

When the development (S235) is completed, the conveyance system 101 conveys the substrate 2, on which the hole pattern is formed, from the development apparatus 104 to the film formation apparatus 107.

The film formation apparatus 107 carries out a film formation process of embedding an electrically conductive substance in the hole pattern, for example, by CVD or plating (S236). The electrically conductive substance may be a material which includes a metal such as tungsten or copper as a main component. As a result, the via conductors 5 which are disposed at the height corresponding to the upper ends of the electrodes 4 and are overlapped with the electrodes 4 of the non-defective chip region CR among the plural chip regions CR are formed, and formation of the via conductors 5 overlapped with the electrodes 4 of the defective chip regions can be avoided.

Then, a wiring pattern is formed (S24). The conveyance system 101 conveys the substrate 2 from the film formation apparatus 107 to the application apparatus 102. When the substrate 2 is placed on the stage of the application apparatus 102, the application apparatus 102 applies an insulating material, which includes, for example, a positive-type photosensitive material or a negative-type photosensitive material, to the substrate 2. When the application is completed, the conveyance system 101 conveys the substrate 2 from the application apparatus 102 to the exposure apparatus 103. In the exposure apparatus 103, the conveyed substrate 2 is set on the substrate stage, and the resist 9i above the substrate 2 is subjected to exposure with the mask MK1. As a result, a latent image pattern corresponding to the mask data is formed on the resist 9i. When the exposure process is completed, the conveyance system 101 conveys the substrate 2 after the exposure to the development apparatus 104. When the substrate 2 is conveyed, the development apparatus 104 subjects the substrate 2 to development. The development apparatus 104 develops the latent image pattern formed on the resist 9i of the substrate 2. As a result, the substrate 2 on which the groove pattern is formed on the resist 9 is obtained. When the development is completed, the conveyance system 101 conveys the substrate 2, on which the groove pattern is formed, from the development apparatus 104 to the film formation apparatus 107. The film formation apparatus 107 carries out a film formation process of embedding an electrically conductive substance in the groove pattern, for example, by CVD or plating.

As a result, as illustrated in FIG. 13C and FIG. 13D, the lines 7 and 8 which are disposed at the height corresponding to the upper ends of the via conductors 5 and pass through the upper side of the electrodes 4 of the chip regions CR can be formed. The lines 7 and 8 are connected to the electrodes 4 via the via conductors 5 in the non-defective chip regions and are insulated from the electrodes 4 via the interlayer insulating film 6 in the defective chip region. In other words, the wiring which is connected to the electrodes 4 of the non-defective chip regions CR among the plural chip regions CR and is not connected to the electrodes 4 of the defective chip region CR can be formed. By virtue of this, in the semiconductor device 1 including the plural chip regions CR as one system, if the chip region CR which is part of the plural chip regions CR is a defective chip region, the semiconductor device 1 can be recovered as a non-defective product.

As described above, in the third embodiment, the interlayer insulating film is formed with the negative-type photosensitive material, each chip region is subjected to exposure with the mask of the non-defective chip region to form the latent image pattern of the via pattern, and then, the defective chip region is selectively subjected to additional exposure to remove the latent image pattern. Also as a result of this, the via conductors 5 are formed on the electrodes 4 of the non-defective chip regions, and formation of the via conductors 5 on the electrodes 4 of the defective chip region can be avoided.

Note that the additional exposure (S233) illustrated in FIG. 19 may be carried out by local exposure. In the local exposure, the latent image pattern to be removed is subjected to exposure locally. For example, the local exposure can be easily carried out by using the exposure apparatus (electron-beam drawing apparatus) 105 instead of the exposure apparatus 103.

For example, if the exposure target is the chip region CR2, the latent image patterns LI171 and LI181 illustrated in FIG. 20A and FIG. 20B are formed on the chi-region-CR2 part of the interlayer insulating film 16i by using the mask MK3 for non-defective chip regions. FIG. 20A illustrates, as an example, the latent image patterns LI171 and LI181 overlapped with the electrodes 4 of the chip region CR2 when viewed through in the Z-direction. FIG. 20B illustrates that the latent image pattern LI181 is formed on the electrodes 4 of the chip region CR2.

Figure 22A:
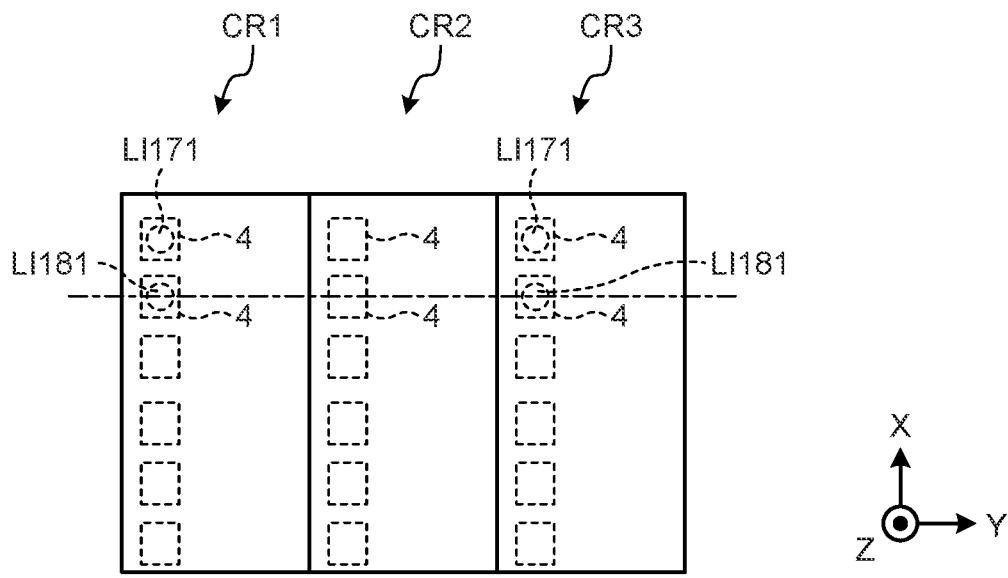
FIG. 22A and FIG. 22B are a plan view and a cross-sectional view illustrating a manufacturing method of a semiconductor device according to a modification example of the third embodiment.
Figure 22B:
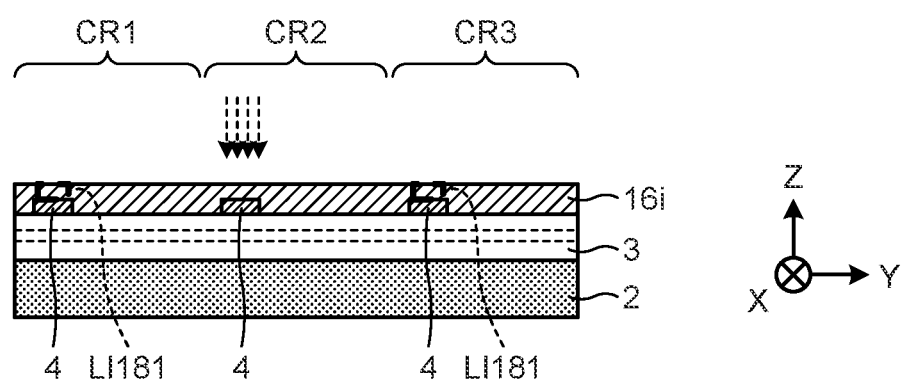

Then, as illustrated in FIG. 22A and FIG. 22B, additional exposure is carried out by local exposure. FIG. 22A illustrates that the regions in the chip region CR2 corresponding to the latent image patterns LI171 and LI181 (in other words, the part in the chip region CR2 which is not subjected to exposure with the mask MK3) are subjected to local exposure as additional exposure and that the latent image patterns LI171 and LI181 are removed. FIG. 22B illustrates that the latent image pattern LI181 on the electrodes 4 of the chip region CR2 is removed.

Also as a result of this, the via conductors 5 are formed on the electrodes 4 of the non-defective chip regions, and formation of the via conductors 5 on the electrodes 4 of the defective chip region can be avoided.

Other Embodiments (a) In the above described embodiments, in the exposure of the interlayer insulating film 6*i* and the resist 9*i*, the mask for non-defective chip regions and the mask for defective chip regions which are formed in advance are used. However, the interlayer insulating film 6*i* and the resist 9*i* can be subjected to exposure without using the masks by using the exposure apparatus 105, which can carry out exposure without the masks.

For example, a case in which the resist 9*i* of the first embodiment is subjected to exposure will be described.

Depending on the inspection results, the host controller 109 controls the exposure apparatus 105 so as to use the pattern data that bypasses the upper side of via openings in the defective chip region CR2 among the chip regions CR1 to CR3 and so as to use the pattern data that passes through the upper side of via openings in the non-defective chip regions CR1 and CR3.

In a case in which the interlayer insulating film 6*i* of the second embodiment is to be subjected to exposure, depending on the inspection results, the host controller 109 controls the exposure apparatus 105 so as to use the pattern data that does not form vias in the defective chip region CR2 among the chip regions CR1 to CR3 and so as to use the pattern data that forms vias in the non-defective chip regions CR1 and CR3.

Also as a result of this, as well as the above described embodiments, the line 7 and the line 8 which pass through the pads of the non-defective chip regions, but bypass the pads of the defective chip region can be formed.

Figure 23:
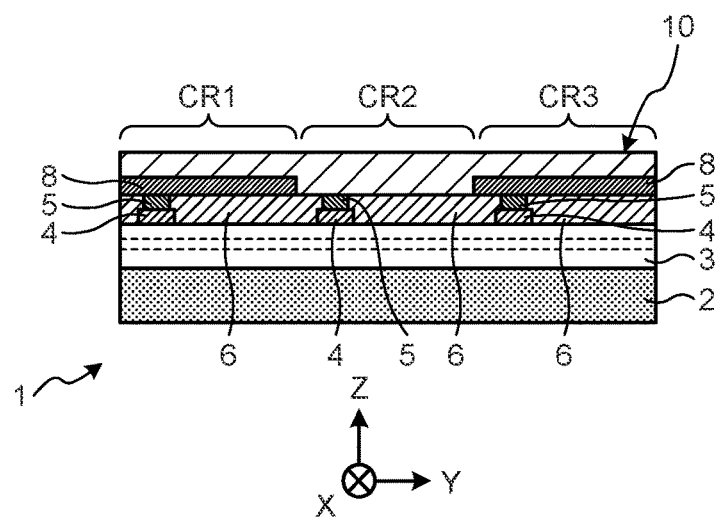
FIG. 23 is a cross-sectional view illustrating a manufacturing method of a semiconductor device according to another embodiment.
Figure 24:
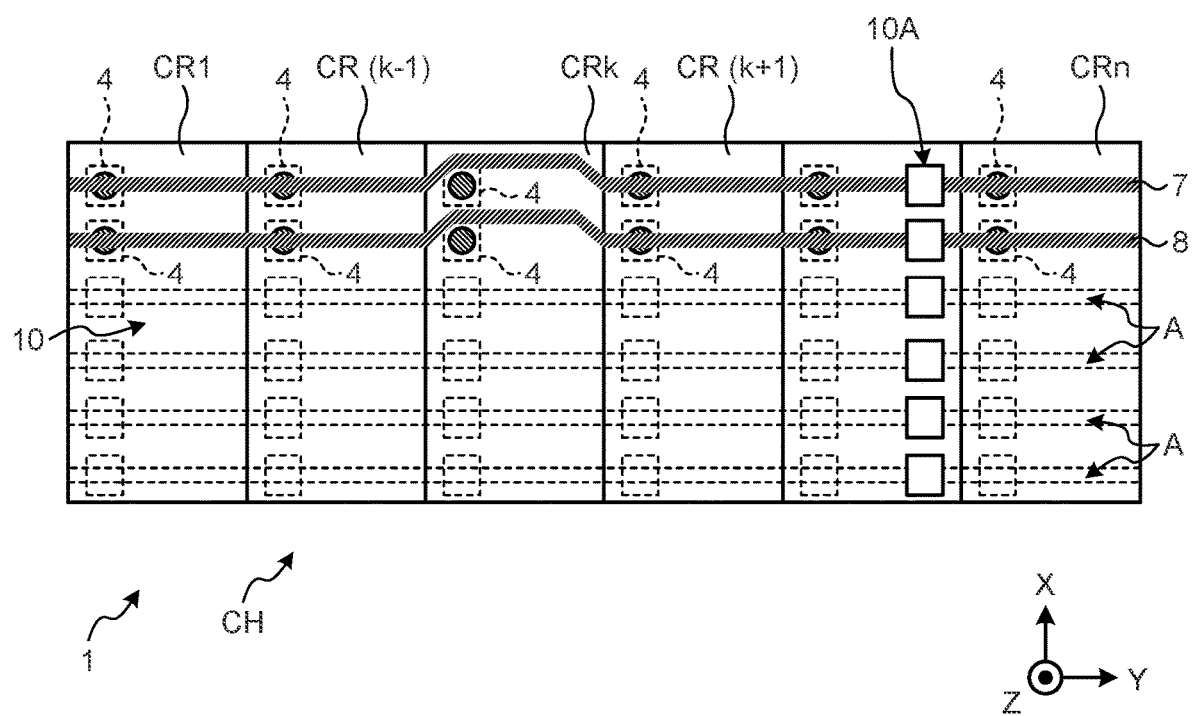
FIG. 24 is a plan view illustrating the manufacturing method of the semiconductor device according to the other embodiment.

(b) In the first embodiment, the resist 9 is remaining between the lines 7 and 8. However, instead of that, the interlayer insulating film 10 may be formed after stripping off the resist 9 as illustrated in FIG. 23. In this process, openings 10A may be appropriately provided in the interlayer insulating film 10 as illustrated in FIG. 24 and configured to enable electric contact with external devices. Note that defective chips are not required to be avoided in lines A other than the power line 7 and the ground line 8. The lines A are assumed to be the lines which transmit signals. In this case, since the power line 7 and the ground line 8 are bypassing the defective chip, the defective chip(s) does not work. Therefore, even when the lines A contact and go through the pads of defective chips, it is less likely that the signals transmitted by the lines A are affected by the defective chips. However, as a matter of course, the lines A for signals may also bypass the pads of defective chips. For example, a case with a defect in which the pads to which the line A is connected are short-circuited with each other is affected if the line A is connected to the pads of the defective chip. In such a case, it is better to bypass all the pads of the defective chip.

(c) Other electrode formation methods of the above described embodiments will be described.

Figure 25D:
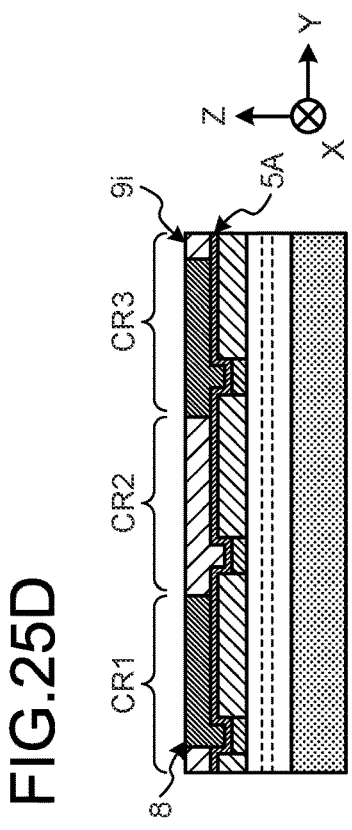
FIG. 25A to FIG. 25E are cross-sectional views illustrating a manufacturing method of a semiconductor device according to another embodiment.
Figure 25E:
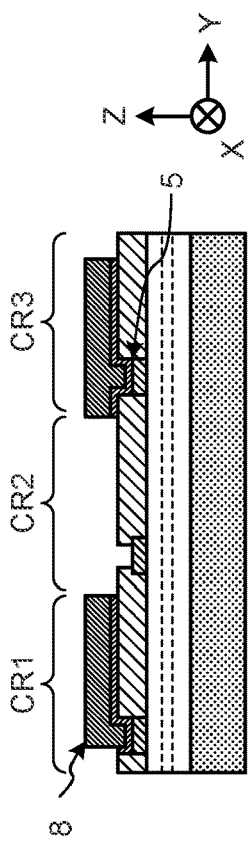
Figure 25A:
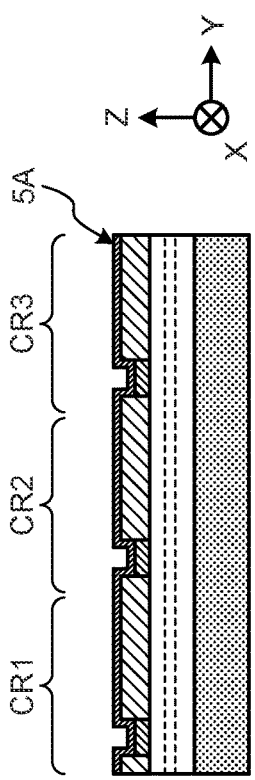
Figure 25B:
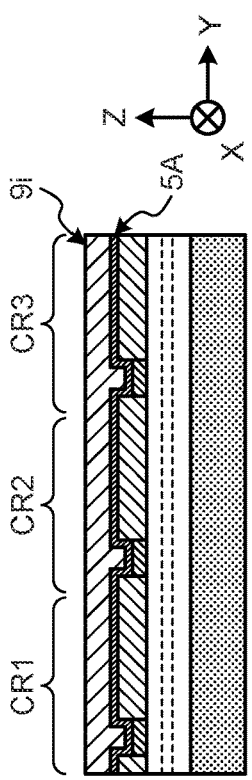
Figure 25C:
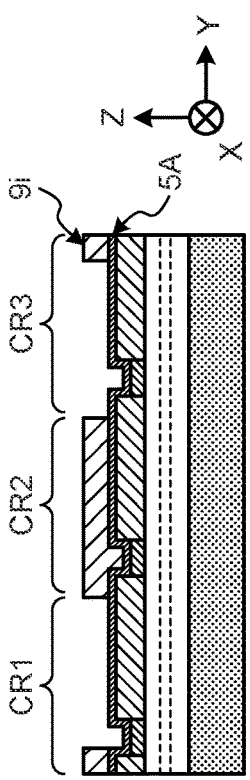

As illustrated in FIG. 25A, for example, after openings are formed in the interlayer insulating film 6*i* in the first embodiment, a metal film 5A is formed on the interlayer insulating film 6*i* and the openings by the film formation apparatus 107. The metal film 5A is, for example, a stacked film of Ti/Cu. The metal film 5A has a thickness that does not fully fill the openings. Then, as illustrated in FIG. 25B, the resist 9*i* is applied. Then, as illustrated in FIG. 25C, as well as the first embodiment, exposure/development is carried out separately for non-defective chip regions and defective chip regions to form a groove pattern. Then, as illustrated in FIG. 25D, plating wiring is formed in groove parts, for example, by Cu plating. In this process, the openings are also filled with the plating, and the via conductors 5 are formed. Then, as illustrated in FIG. 25E, after the resist 9*i* is stripped off, the metal film 5A of the part on which the plating wiring is not formed by etching. The etching may be wet or dry. Also as a result of this, as well as the first embodiment, the line 7 and the line 8 which pass through the pads of non-defective chip regions, but bypass the pads of defective chip regions can be formed.

(d) Another electrode formation method of the above described embodiment will be described.

Figure 26A:
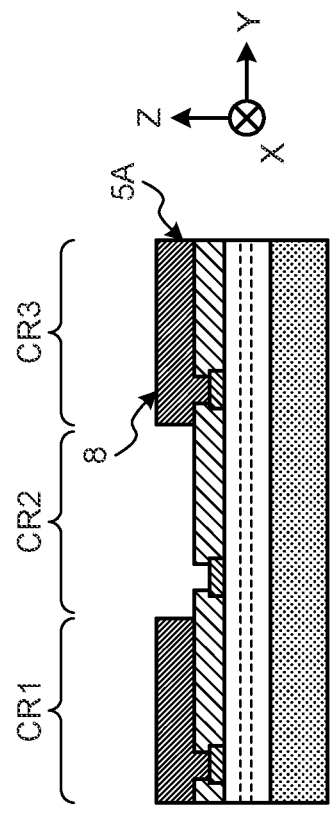
FIG. 26A to FIG. 26C are cross-sectional views illustrating a manufacturing method of a semiconductor device according to another embodiment.
Figure 26B:
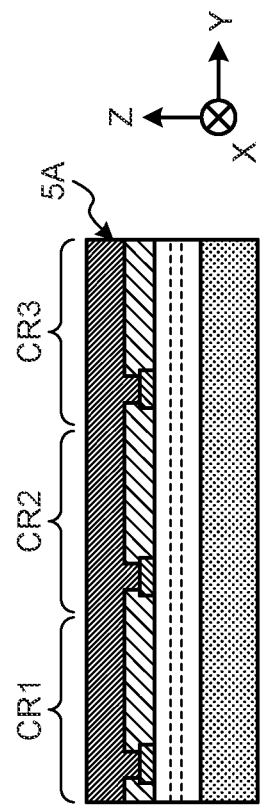
Figure 26C:
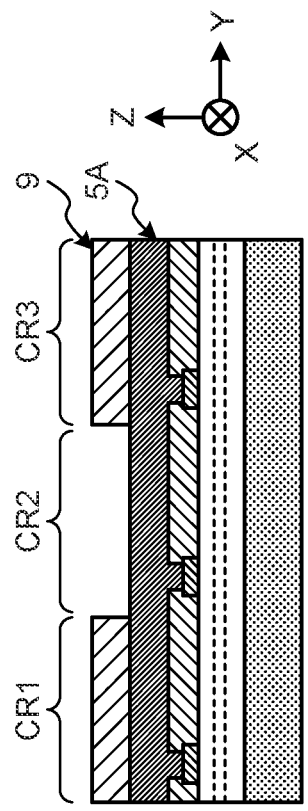

In the above described embodiment, as illustrated in FIG. 26A, the metal film 5A is formed as a thick film. In this case, openings of the insulating film 6*i* are also fully filled with the metal film 5A and serve as the via conductors 5. Then, as illustrated in FIG. 26B, as well as the first embodiment, non-defective chip regions and defective chip regions are separately subjected to exposure/development to form the resist pattern 9 (see FIG. 9A to FIG. 9C) which pass through the pads of the non-defective chip regions, but bypass the pads of the defective chip regions. Then, as illustrated in FIG. 26C, the metal 5A is subjected to etching to strip off the resist 9. Also as a result of this, as well as the first embodiment, the line 7 and the line 8 which pass through the pads of non-defective chip regions, but bypass the pads of defective chip regions can be formed.

(e) In the above described embodiment, the mask for non-defective chip regions and the mask for defective chip regions are formed outside the system 100 in advance. However, the mask for non-defective chip regions and the mask for defective chip regions may be formed in the system 100 by inline, and the exposure of the first to third embodiment may be carried out by using the masks.

For example, the case of the first embodiment is taken as an example and described as below.

In step S4, the host controller 109 acquires layout data for a processing target layer (in other words, the resist 9*i*), layout data for non-defective chip regions, and layout data for defective chip regions. The layout data for non-defective chip regions includes a pattern of a line which passes through the via conductors 5 of the non-defective chip regions. The layout data for defective chip regions includes a pattern of a line that bypasses the via conductors 5 of defective chip regions.

The host controller 109 generates first mask data in accordance with the layout data for non-defective chip regions. The host controller 109 supplies the first mask data to the exposure apparatus 105.

When the exposure apparatus 105 receives the first mask data, the exposure apparatus 105 creates the mask MK1 in accordance with the first mask data. The exposure apparatus 105 draws a pattern on a mask blank in accordance with the first mask data to create the mask MK1. The created mask MK1 can be caused to be in a state that the mask MK1 can be set on the mask stage of the exposure apparatus 103 as the mask for non-defective chip regions.

The host controller 109 generates second mask data in accordance with the layout data for defective chip regions. The host controller 109 supplies the second mask data to the exposure apparatus 105.

When the exposure apparatus 105 receives the second mask data, the exposure apparatus 105 creates the mask MK2 in accordance with the second mask data. The exposure apparatus 105 draws a pattern on a mask blank in accordance with the second mask data to create the mask MK2. The created mask MK2 can be caused to be in a state that the mask MK2 can be set on the mask stage of the exposure apparatus 103 as the mask for defective chip regions.

The wiring pattern processing of the first embodiment may be carried out by using the masks MK1 and MK2 formed in this manner.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device, the manufacturing method comprising:
   inspecting each of plural chip regions of a substrate and determining the inspected chip region as a non-defective chip region or a defective chip region, the substrate including the plural chip regions formed as one system, and the plural chip regions being arranged in a planar direction on the substrate; and
   forming a wiring, the wiring being connected to an electrode of the non-defective chip region among the plural chip regions, and the wiring being not connected to an electrode of the defective chip region among the plural chip regions,
   wherein:
   the forming of the wiring includes:
      forming plural via openings on the electrodes of the plural chip regions; and
      forming a line above the via opening, the line being connected to the electrode through the via opening of the non-defective chip region, and the line extending to bypass the via opening of the defective chip region, and
   the forming of the line includes:
      forming a resist covering the plural via openings;
      forming a first latent image pattern on the resist by subjecting the non-defective chip region to exposure with a first mask, the first latent image pattern passing through an upper side of the via opening;
      forming a second latent image pattern on the resist by subjecting the defective chip region to exposure with a second mask, the second latent image pattern bypassing an upper side of the via opening;
      developing the first latent image pattern and the second latent image pattern to form a first groove pattern and a second groove pattern on the resist; and
      embedding an electrically conductive substance in the first groove pattern and the second groove pattern to form the line.

2. A manufacturing method of a semiconductor device, the manufacturing method comprising:
   inspecting each of plural chip regions of a substrate and determining the inspected chip region as a non-defective chip region or a defective chip region, the substrate including the plural chip regions formed as one system, and the plural chip regions being arranged in a planar direction on the substrate; and
   forming a wiring, the wiring being connected to an electrode of the non-defective chip region among the plural chip regions, and the wiring being not connected to an electrode of the defective chip region among the plural chip regions,
   wherein:
   the forming of the wiring includes:
      among the plural chip regions, forming a via conductor on the electrode of the non-defective chip region and not forming a via conductor on the electrode of the defective chip region; and
      forming a line disposed at a height corresponding to an upper end of the via conductor and extending to pass through the via conductor, and
   the forming of the via conductor on the electrode of the non-defective chip region and not forming the via conductor on the electrode of the defective chip region includes:
      forming an insulating film covering the electrodes of the plural chip regions;
      subjecting the non-defective chip region to exposure with a third mask to form a third latent image pattern selectively covering a surface of the electrode;
      not subjecting the defective chip region to exposure;
      developing the third latent image pattern of the non-defective chip region to form a hole pattern on the insulating film; and
      embedding an electrically conductive substance in the hole pattern to form the via conductor on the electrode of the non-defective chip region.

3. The manufacturing method according to claim 2, further comprising forming a positive-type resist covering the insulating film,
   wherein the forming of the third latent image pattern includes forming of the third latent image pattern on the resist.

4. A manufacturing method of a semiconductor device, the manufacturing method comprising:
   inspecting each of plural chip regions of a substrate and determining the inspected chip region as a non-defective chip region or a defective chip region, the substrate including the plural chip regions formed as one system, and the plural chip regions being arranged in a planar direction on the substrate; and
   forming a wiring, the wiring being connected to an electrode of the non-defective chip region among the plural chip regions, and the wiring being not connected to an electrode of the defective chip region among the plural chip regions,
   wherein:
   the forming of the wiring includes:
      among the plural chip regions, forming a via conductor on the electrode of the non-defective chip region and not forming a via conductor on the electrode of the defective chip region; and forming a line disposed at a height corresponding to an upper end of the via conductor and extending to pass through the via conductor, and the forming of the via conductor on the electrode of the non-defective chip region and not forming the via conductor on the electrode of the defective chip region includes:

forming an insulating film covering the electrodes of the plural chip regions;

subjecting each chip region to exposure with a third mask to form a third latent image pattern selectively covering a periphery of the electrode;

subjecting the defective chip region to exposure to cancel out the third latent image pattern;

developing the third latent image pattern of the non-defective chip region to form a via in the insulating film; and embedding an electrically conductive substance in the via to selectively form the via conductor on the electrode of the non-defective chip region.

5. The manufacturing method according to claim 4, further comprising forming a negative-type resist covering the insulating film, wherein the forming of the third latent image pattern includes forming of the third latent image pattern on the resist.

6. The manufacturing method according to claim 4, wherein the cancelling out of the third latent image pattern includes subjecting the defective chip region to full-surface exposure.

7. The manufacturing method according to claim 4, wherein the cancelling out of the third latent image pattern includes subjecting, to local exposure, a part in the defective chip region not subjected to exposure with the third mask.

* * * * *